(12) United States Patent
Kumura et al.

(10) Patent No.: US 7,214,982 B2
(45) Date of Patent: May 8, 2007

(54) SEMICONDUCTOR MEMORY DEVICE AND METHOD OF MANUFACTURING THE SAME

(75) Inventors: Yoshinori Kumura, Yokohama (JP); Iwao Kunishima, Yokohama (JP); Tohru Ozaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/959,223

(22) Filed: Oct. 7, 2004

(65) Prior Publication Data

US 2006/0030110 A1 Feb. 9, 2006

(30) Foreign Application Priority Data

Aug. 4, 2004 (JP) ............................. 2004-228359

(51) Int. Cl.
*H01L 27/108* (2006.01)
(52) U.S. Cl. ............... 257/301; 257/304; 257/E27.092; 257/E29.346; 257/E21.396; 257/E21.664; 438/243; 438/386
(58) Field of Classification Search ............... 257/301, 257/303, 310, 304, E27.092, E29.346, E21.396, 257/E21.664; 438/243, 244, 245, 246, 386
See application file for complete search history.

(56) References Cited

U.S. PATENT DOCUMENTS

| 5,903,492 | A | 5/1999 | Takashima | ................... 345/195 |
| 6,015,990 | A | 1/2000 | Hieda et al. | ................ 257/310 |
| 6,521,938 | B2 * | 2/2003 | Hamamoto | ................. 257/304 |

FOREIGN PATENT DOCUMENTS

JP 10-303396 11/1998

* cited by examiner

*Primary Examiner*—George R. Fourson
*Assistant Examiner*—Julio J. Maldonado
(74) *Attorney, Agent, or Firm*—Oblon, Spivak, McClelland, Maier & Neustadt, P.C.

(57) ABSTRACT

A semiconductor device including a ferroelectric random access memory, which has a structure suitable for miniaturization and easy to manufacture, and having less restrictions on materials to be used, comprises a field effect transistor formed on a surface area of a semiconductor wafer, a trench ferroelectric capacitor formed in the semiconductor wafer in one source/drain of the field effect transistor, wherein one electrode thereof is connected to the source/drain, and a wiring formed in the semiconductor wafer and connected to the other electrode of the trench ferroelectric capacitor.

12 Claims, 45 Drawing Sheets

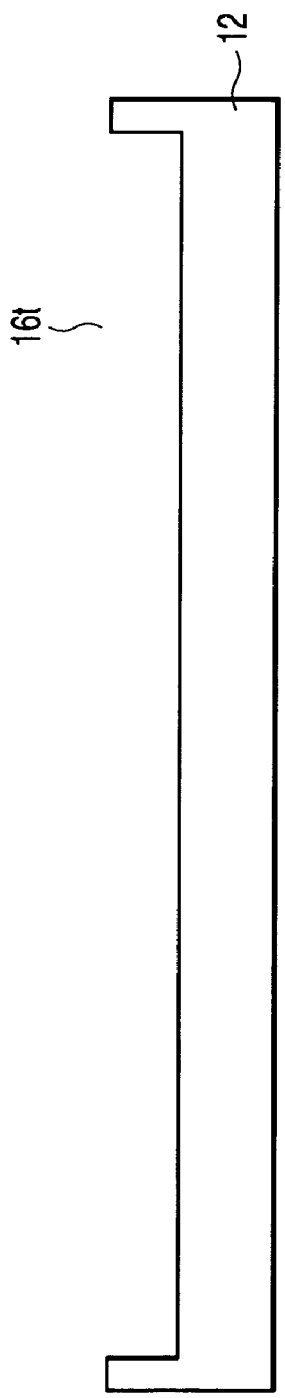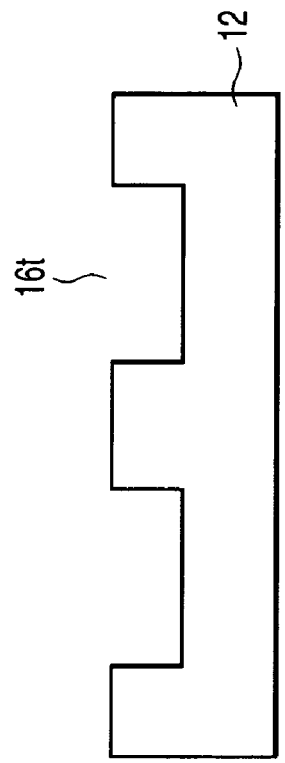
FIG.3A
FIG.3B

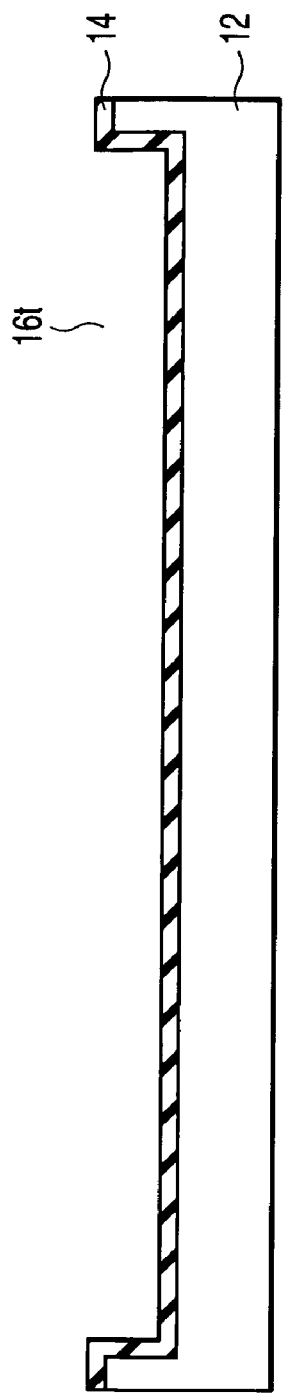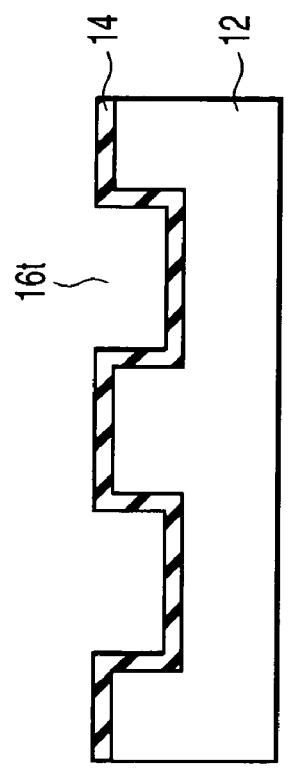
FIG.4A
FIG.4B

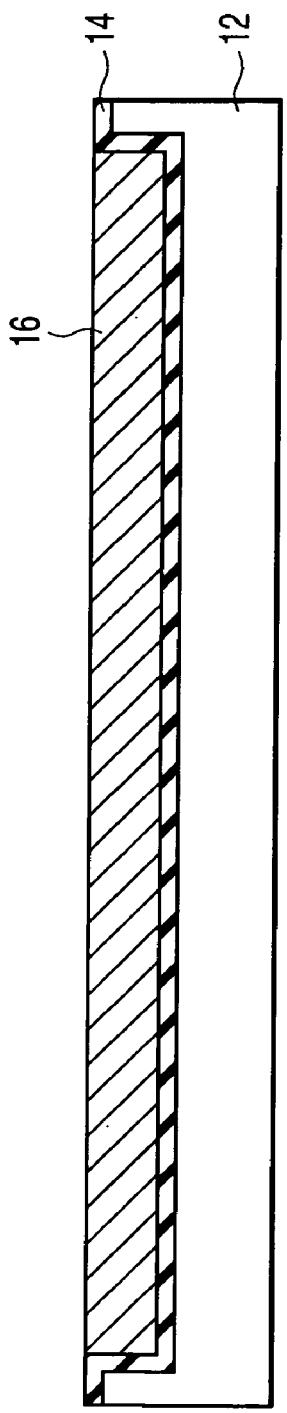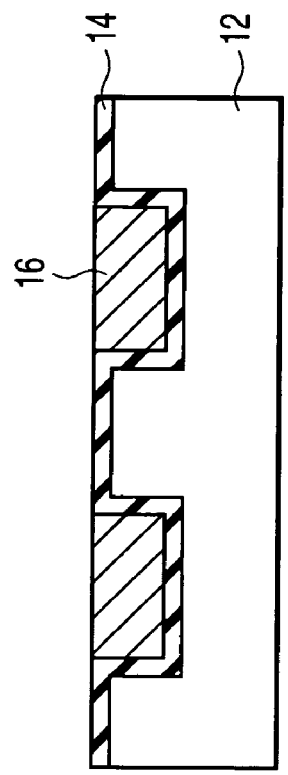
FIG.5A
FIG.5B

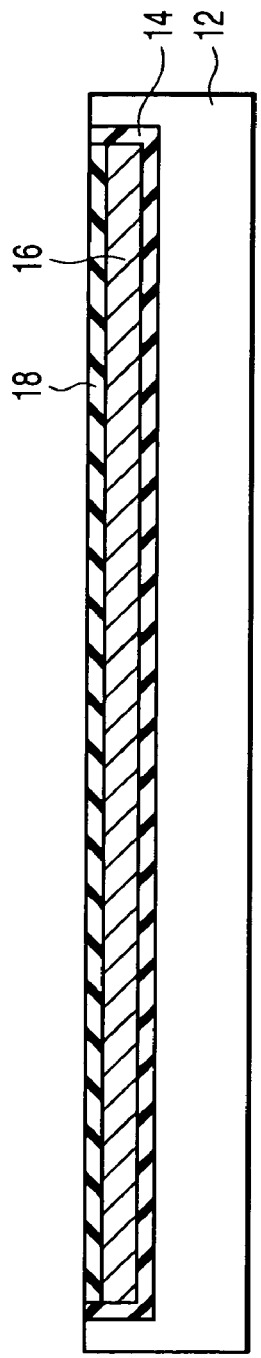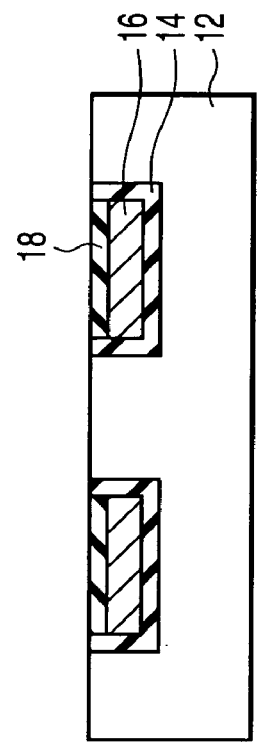
FIG.7A
FIG.7B

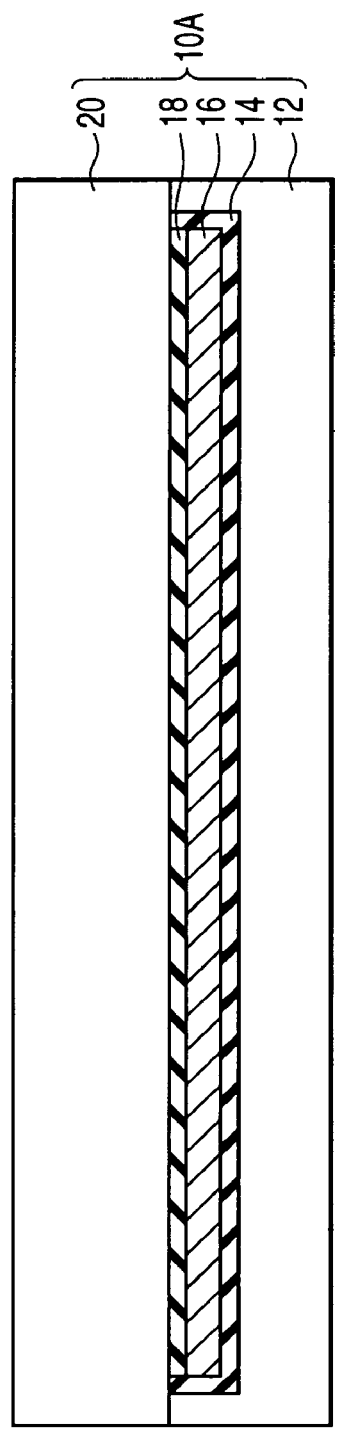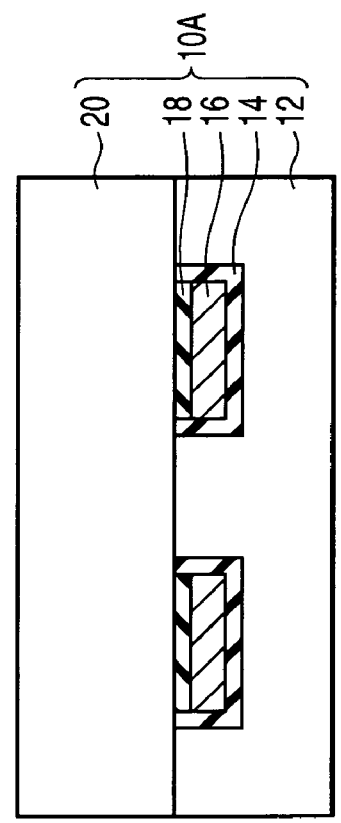
FIG. 8A
FIG. 8B

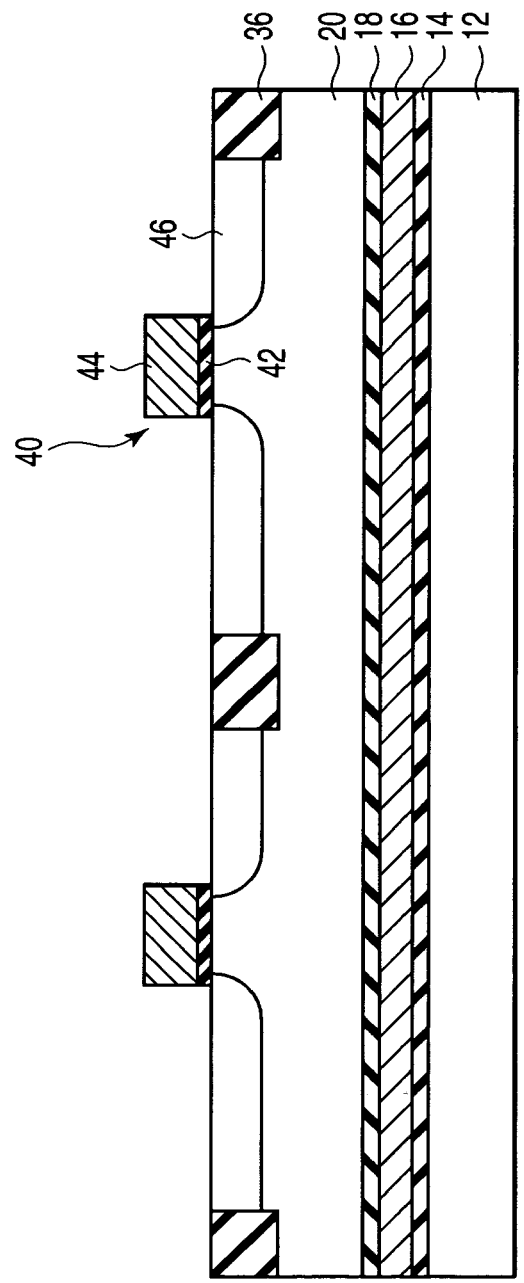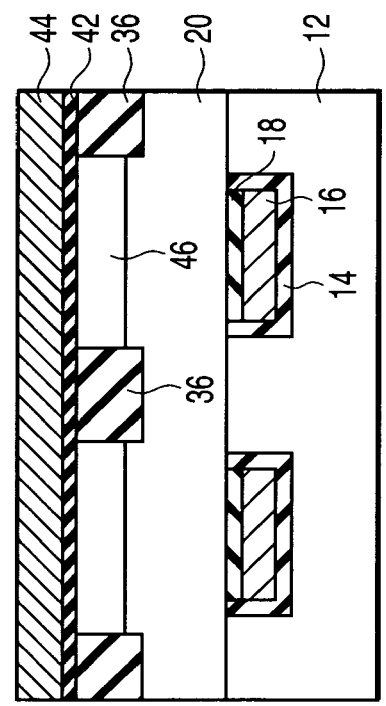
FIG.9A
FIG.9B

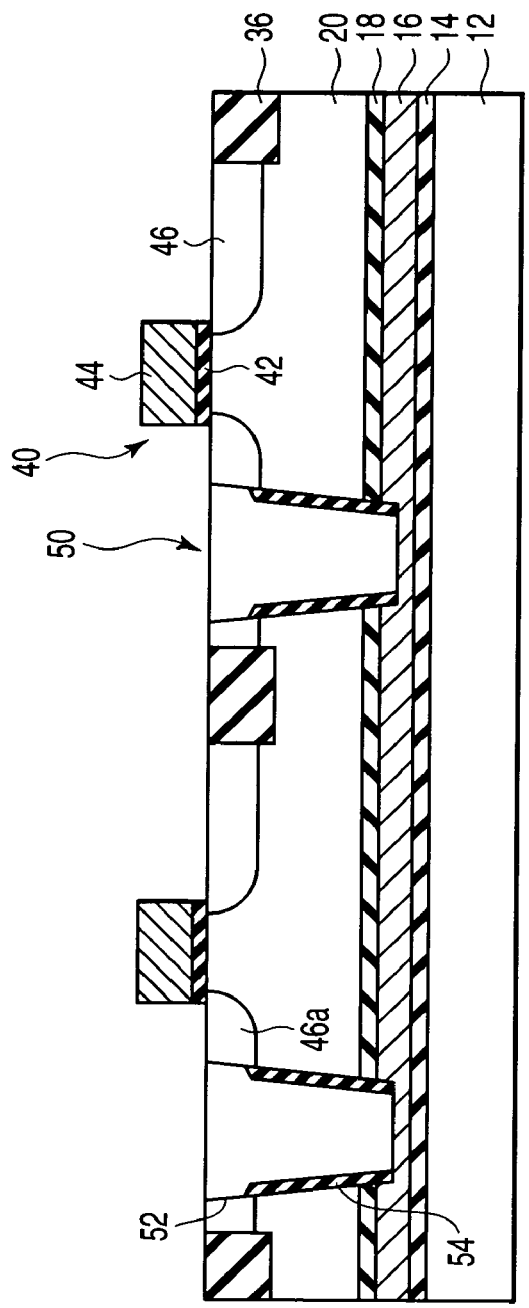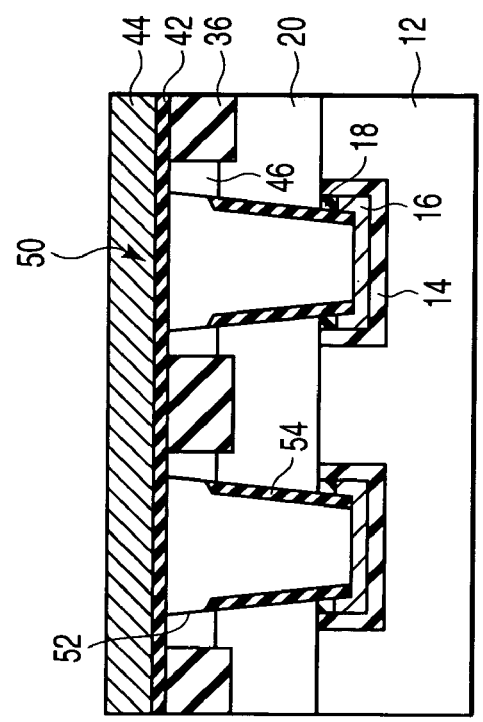
FIG. 10A
FIG. 10B

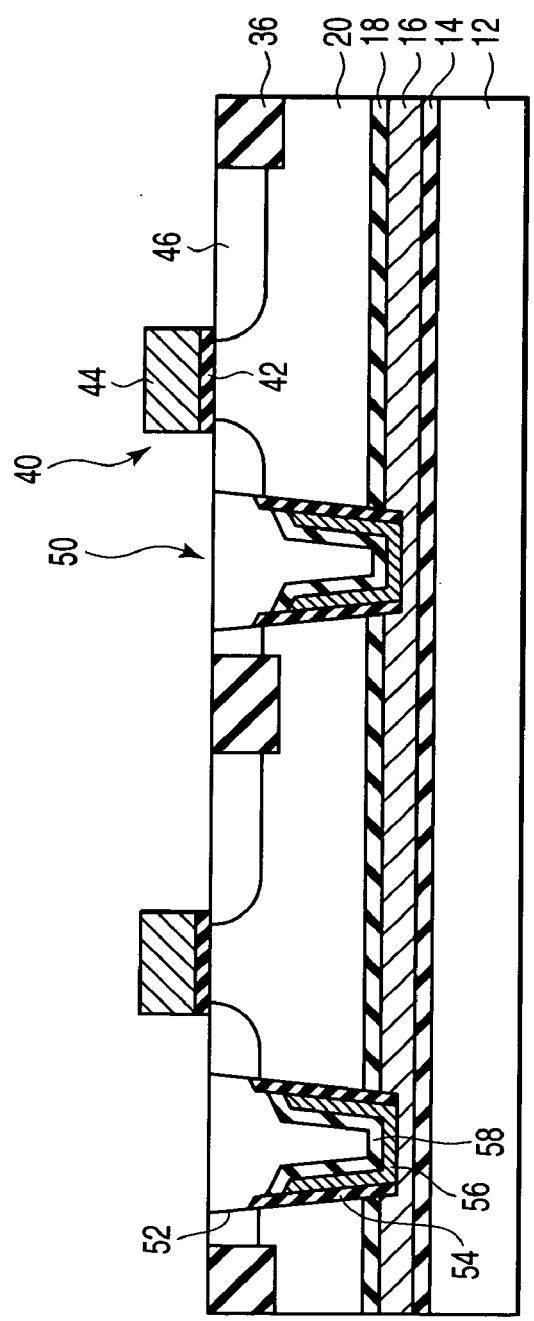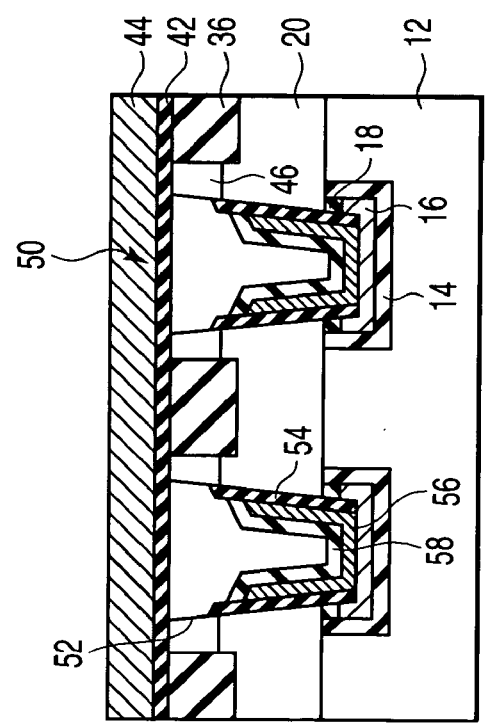
FIG. 11A
FIG. 11B

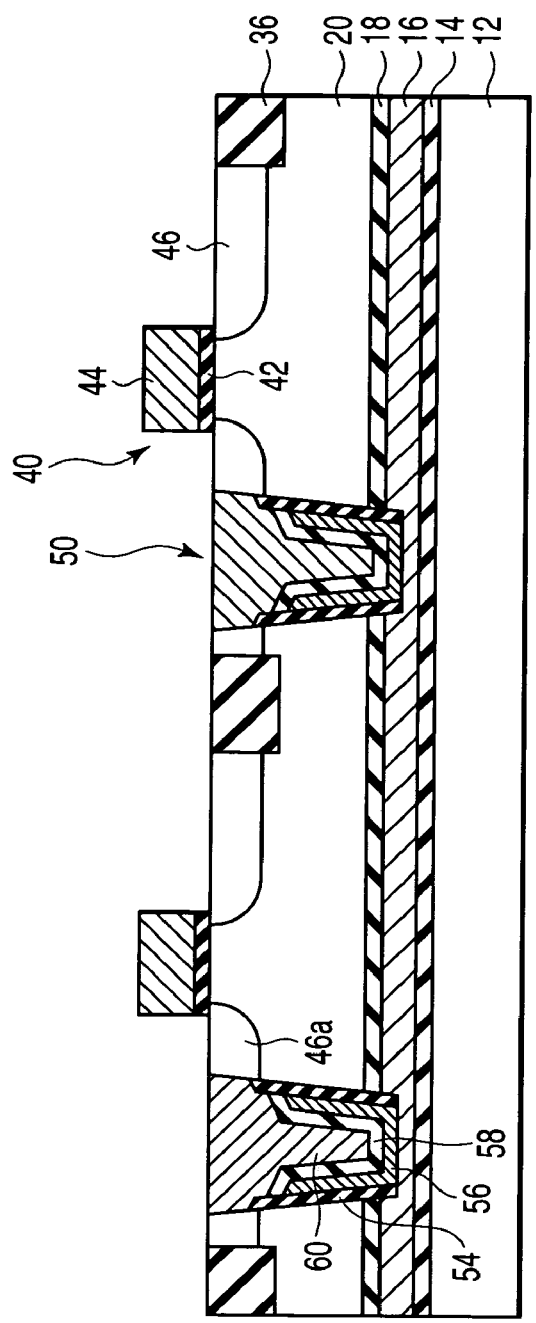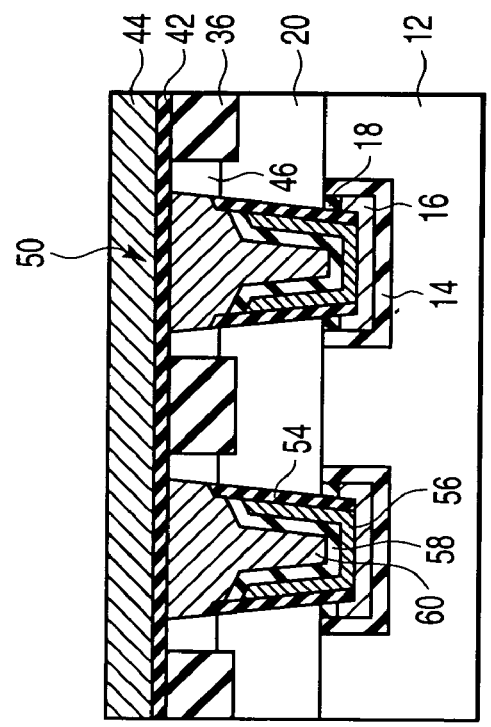
FIG. 12A
FIG. 12B

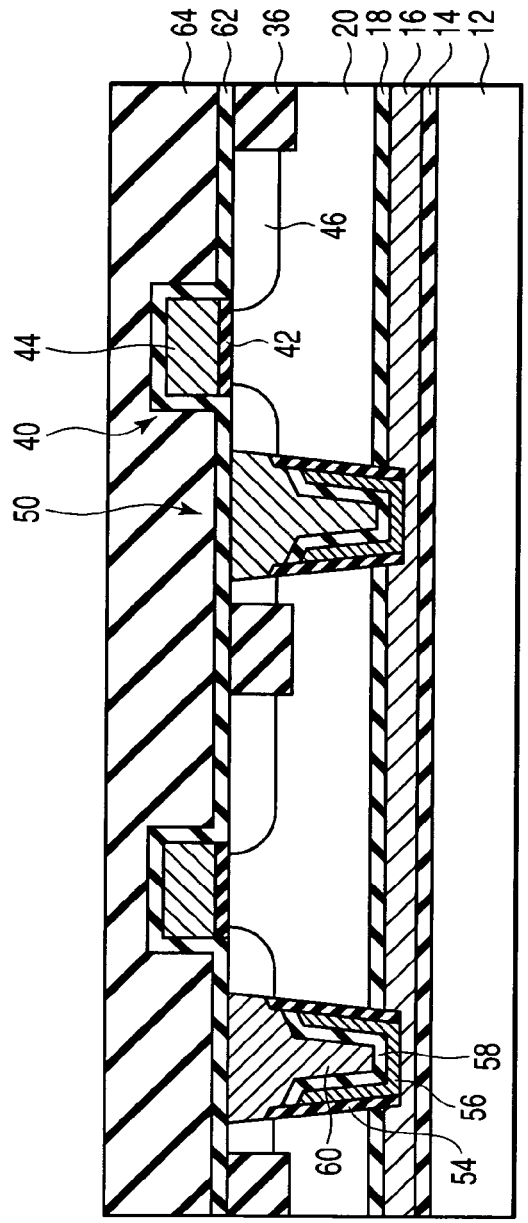
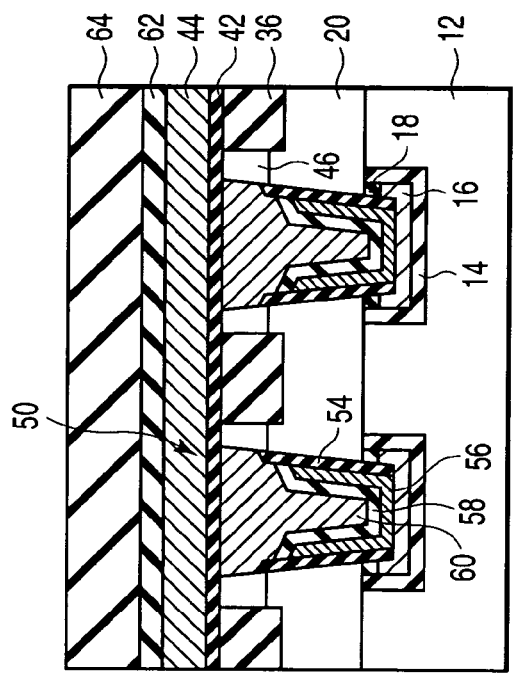
FIG. 13A
FIG. 13B

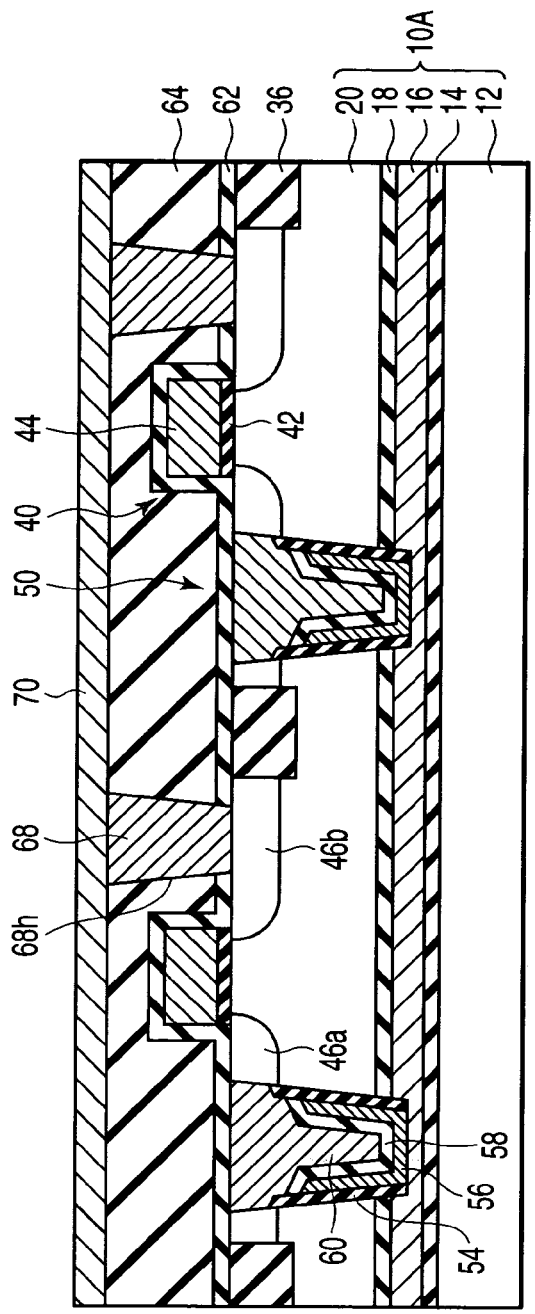
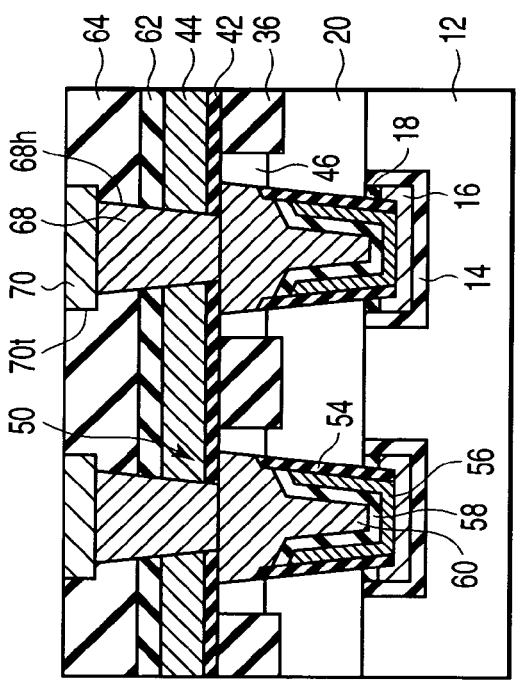
FIG.14A
FIG.14B

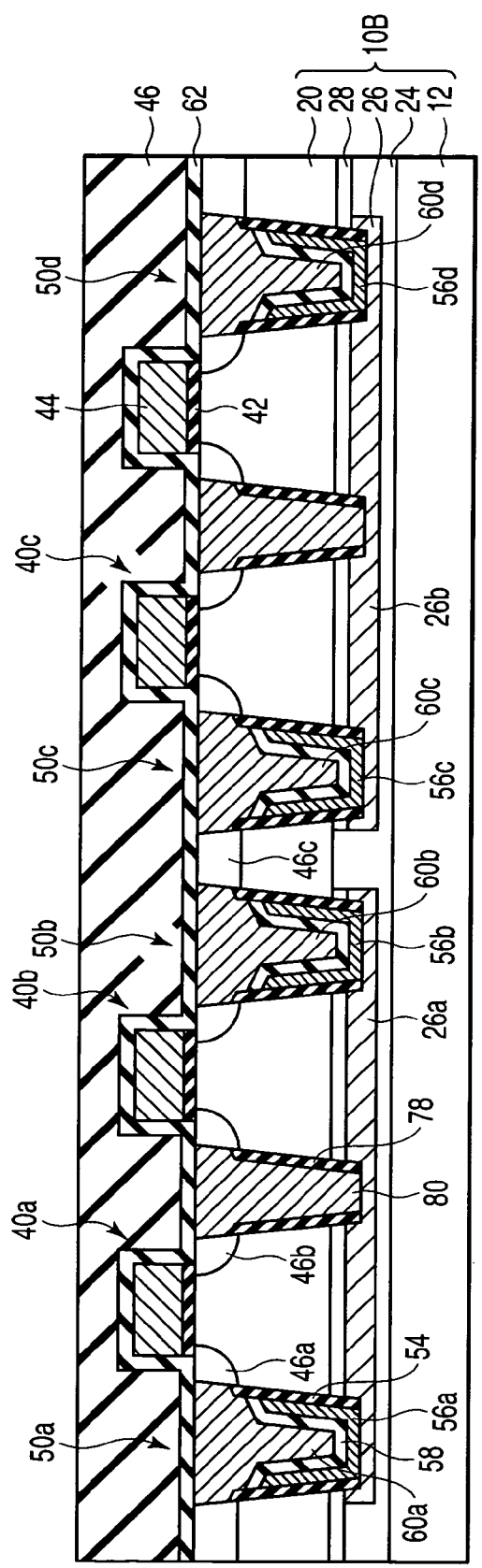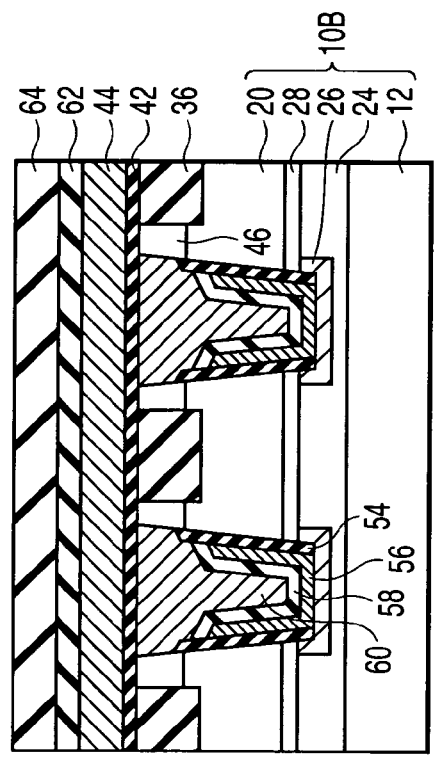
FIG.16A
FIG.16B

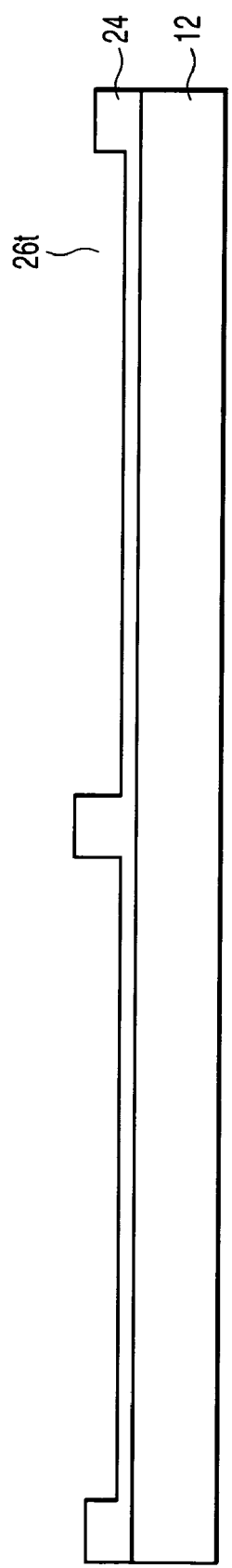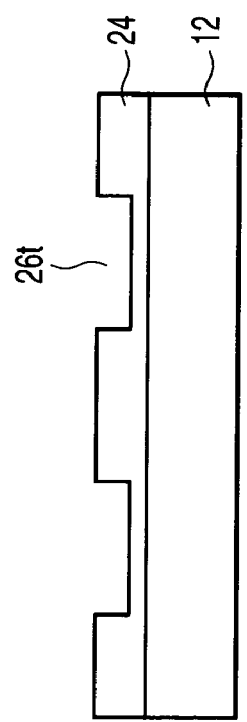

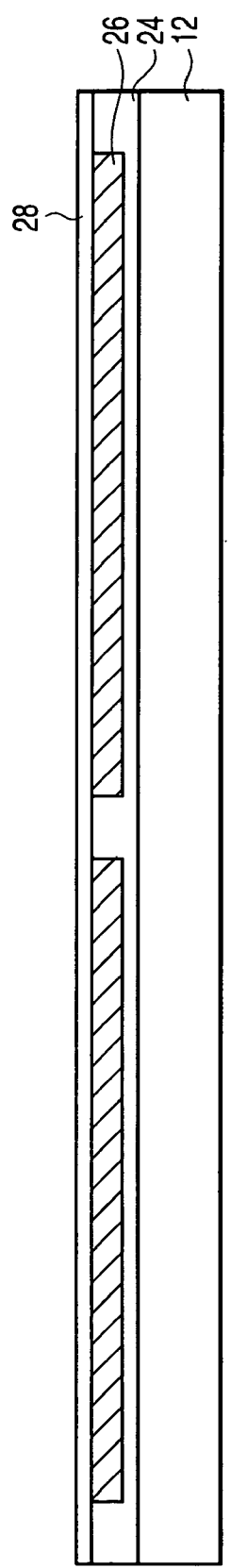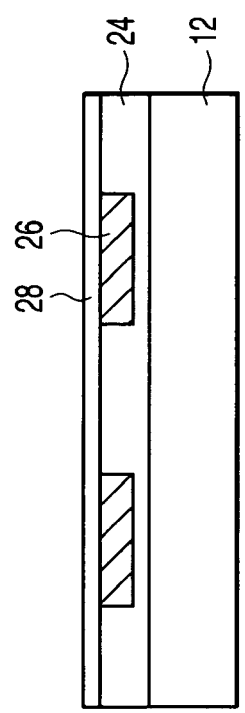
FIG.18A
FIG.18B

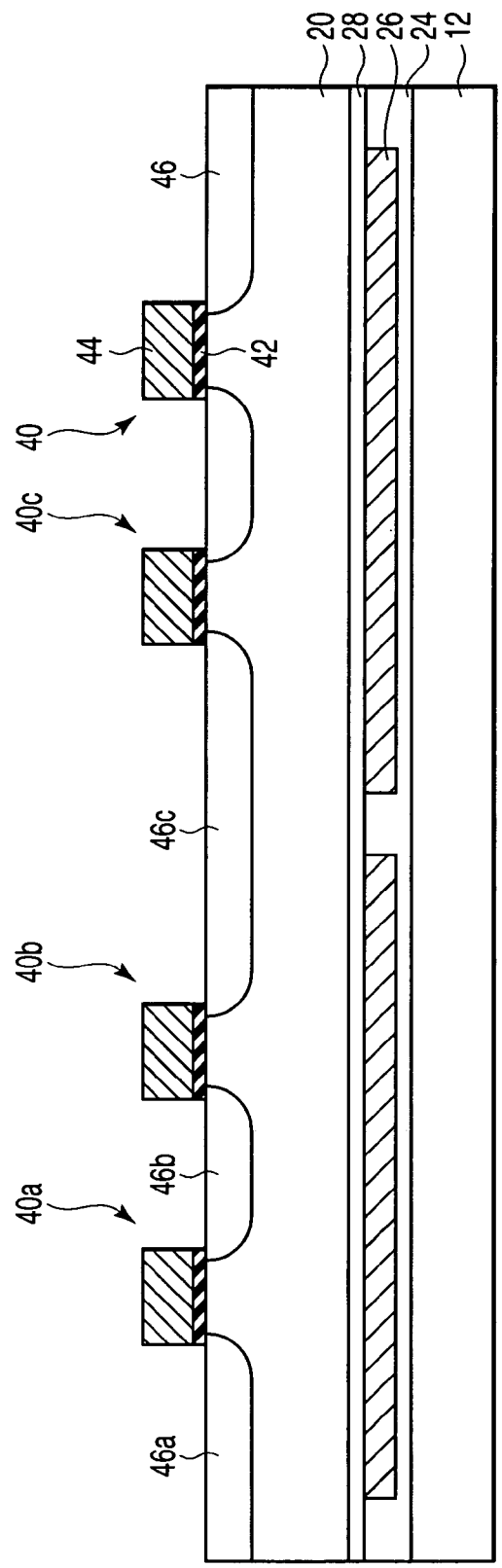
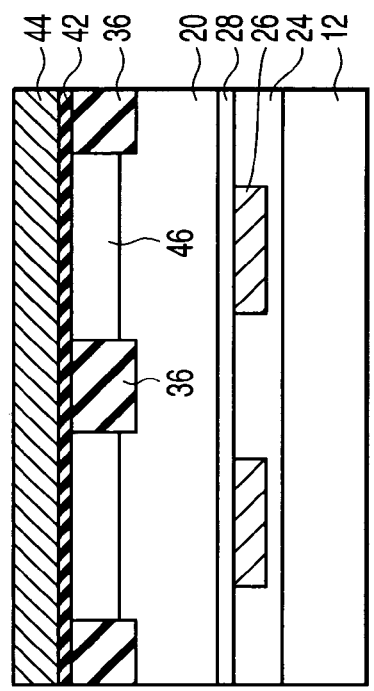
FIG. 20A
FIG. 20B

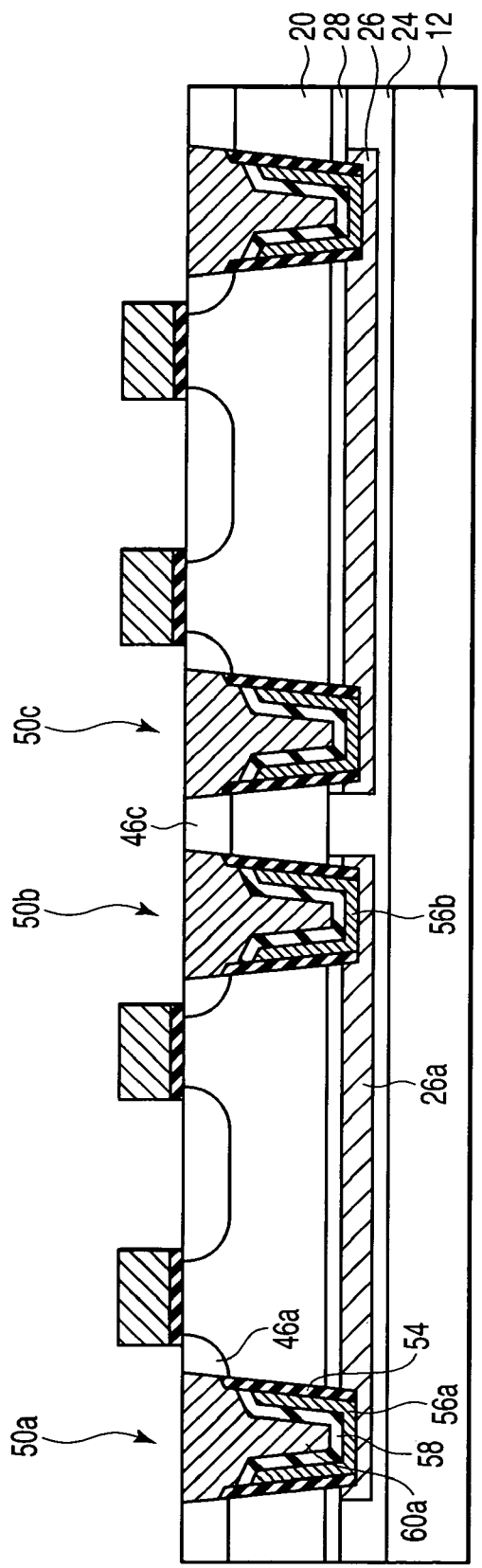
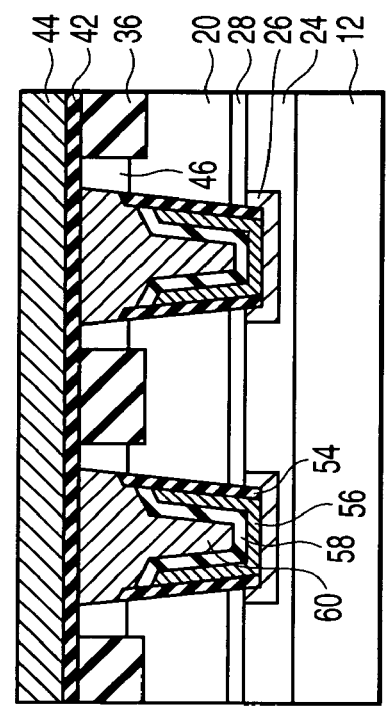
FIG.21A
FIG.21B

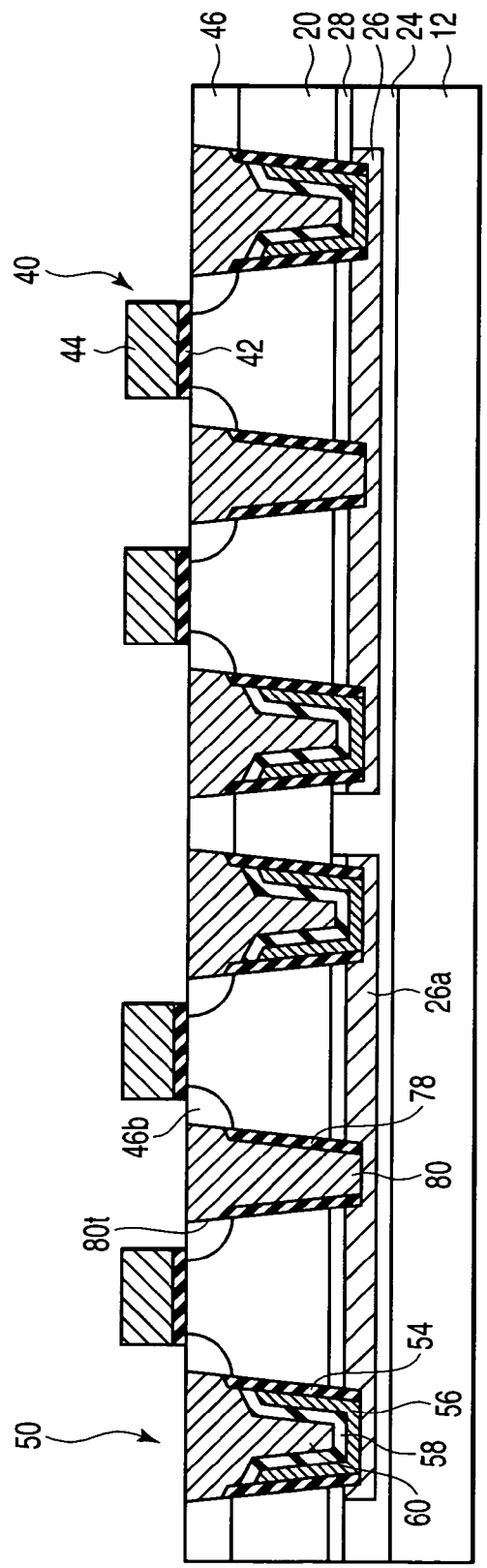
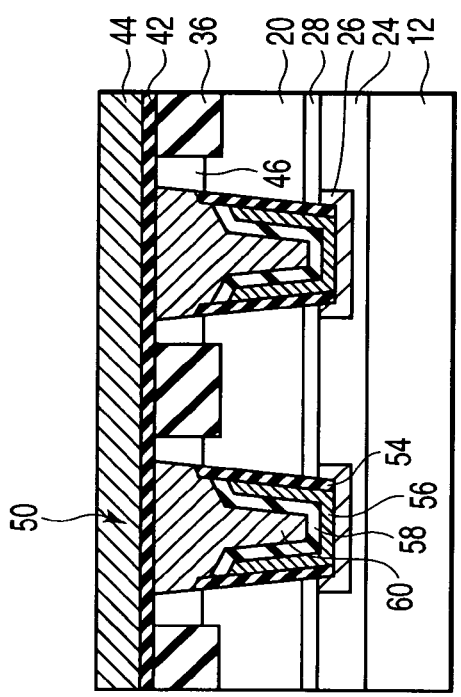
FIG. 22A
FIG. 22B

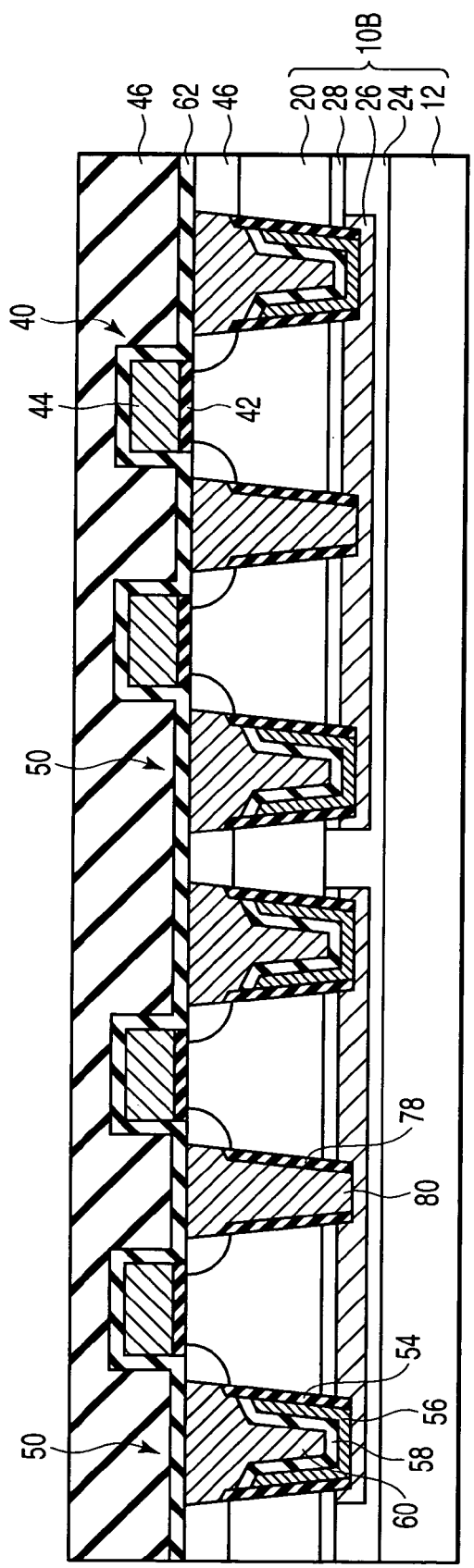
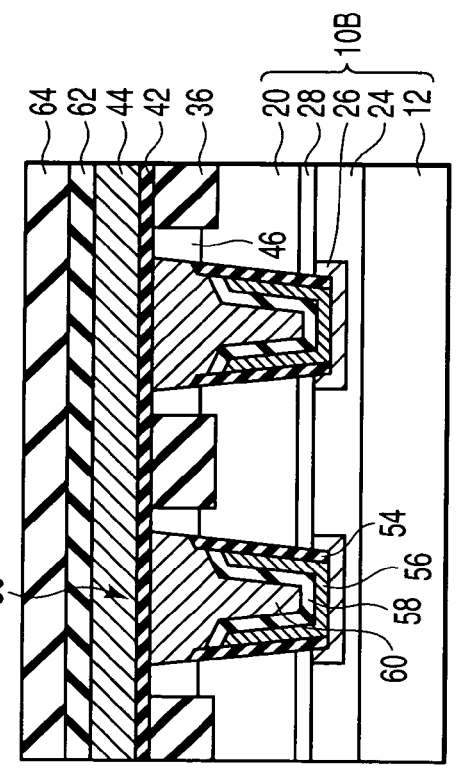
FIG.23A
FIG.23B

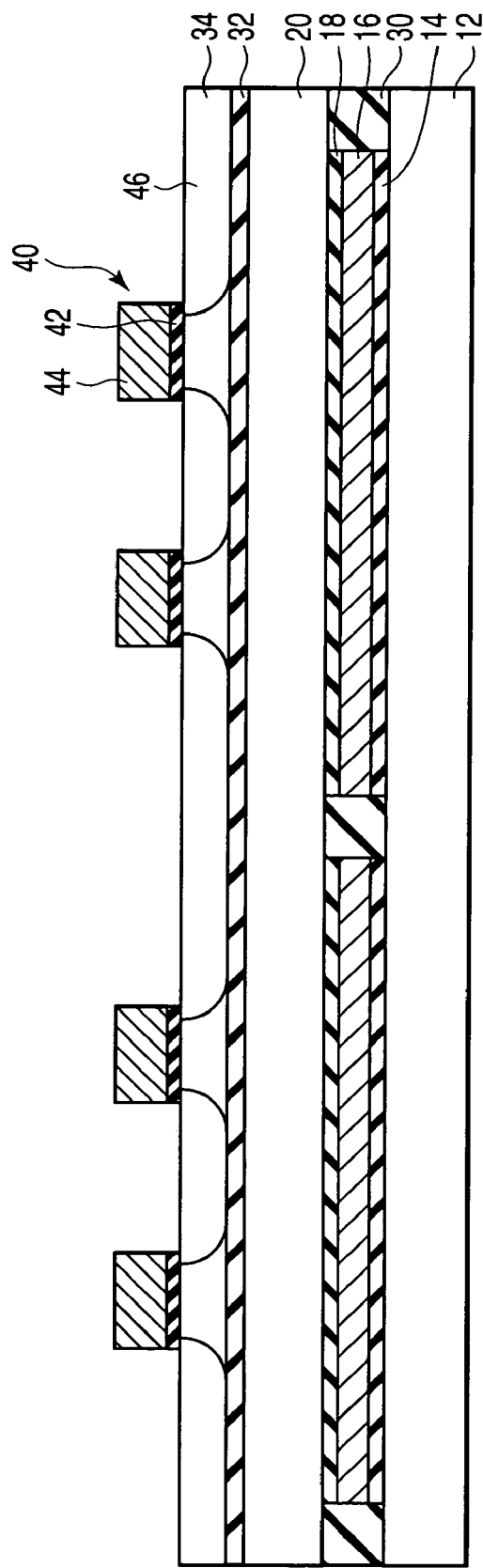
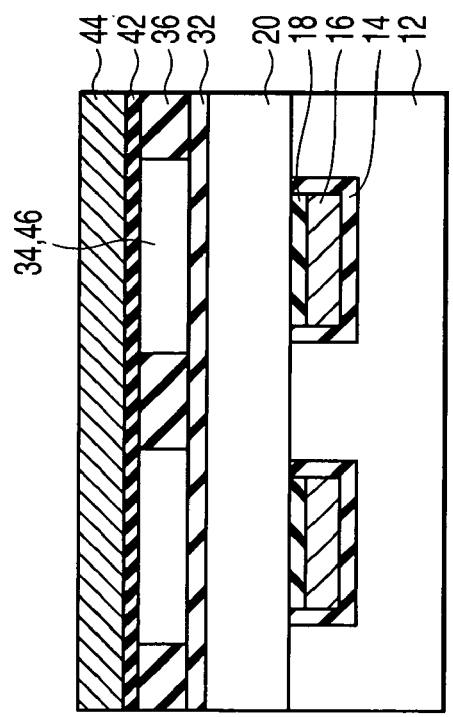
FIG.27A
FIG.27B

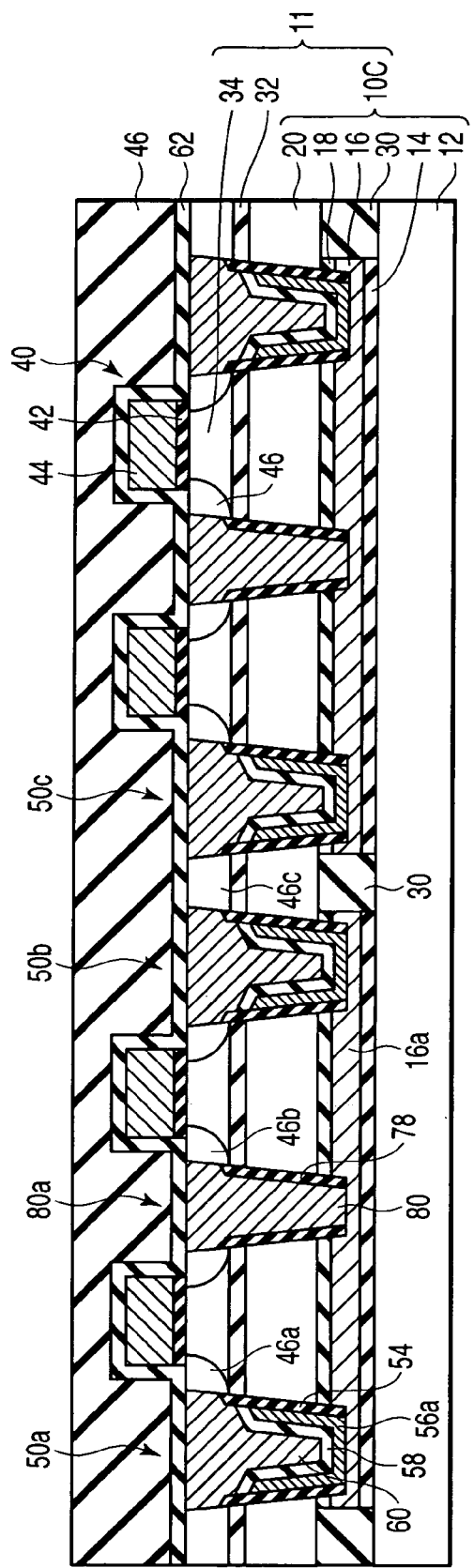
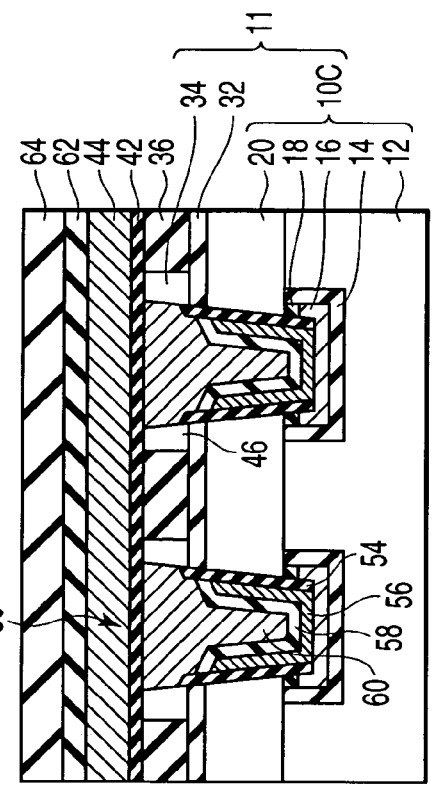
FIG. 28A
FIG. 28B

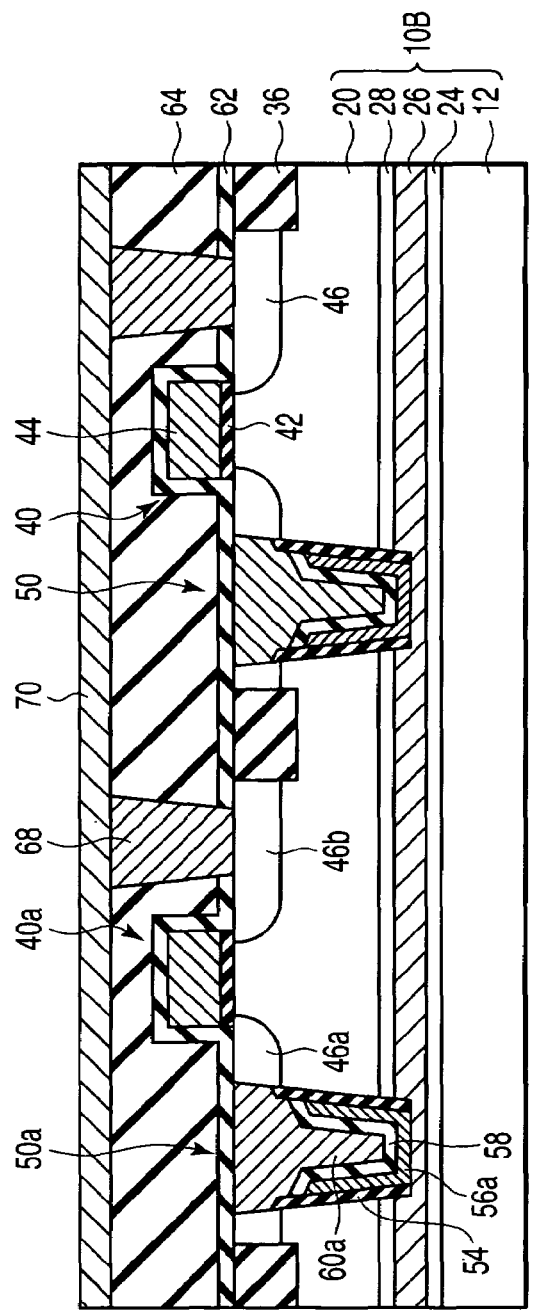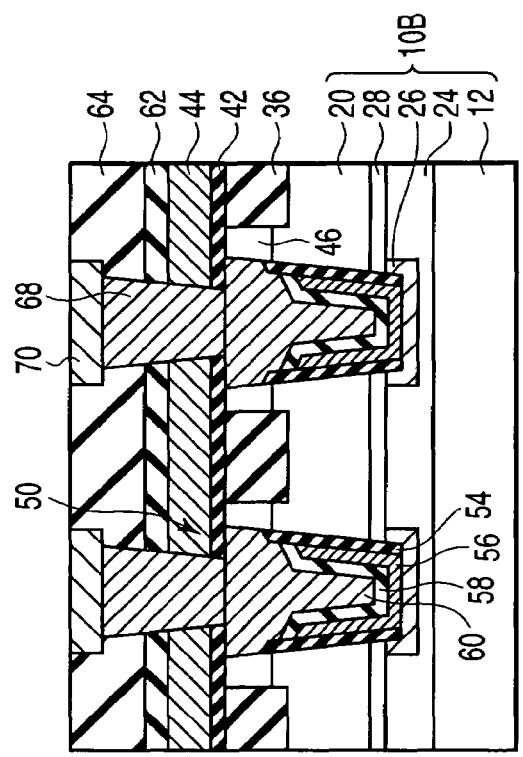
FIG. 29A
FIG. 29B

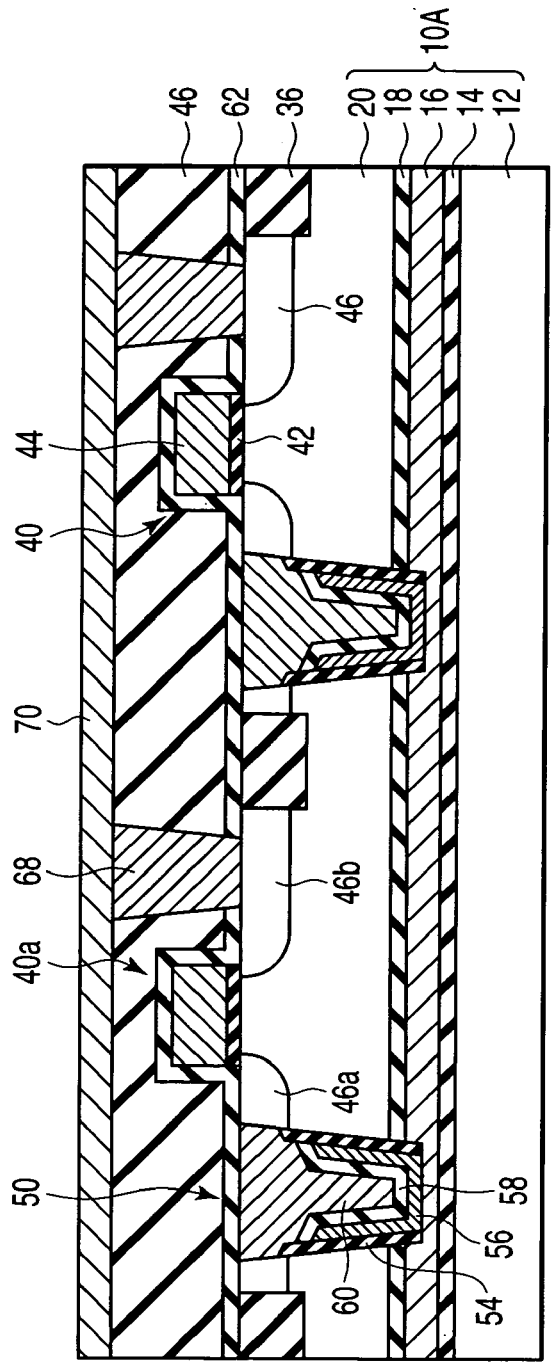
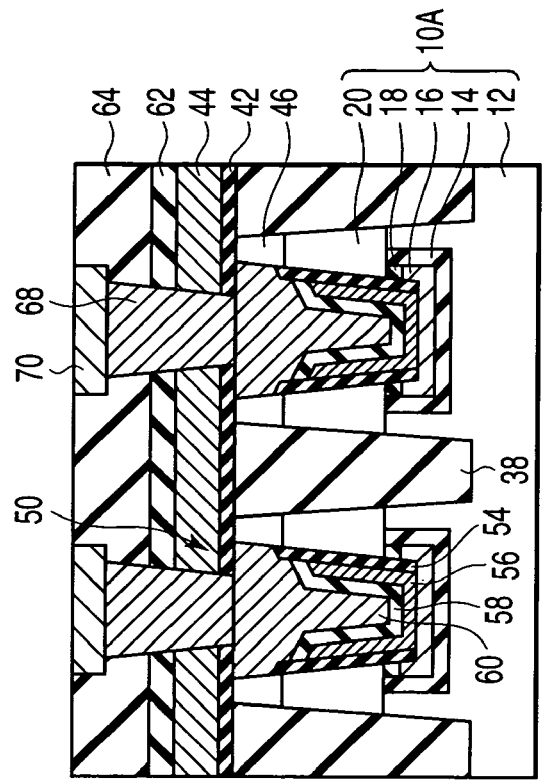
FIG. 30A
FIG. 30B

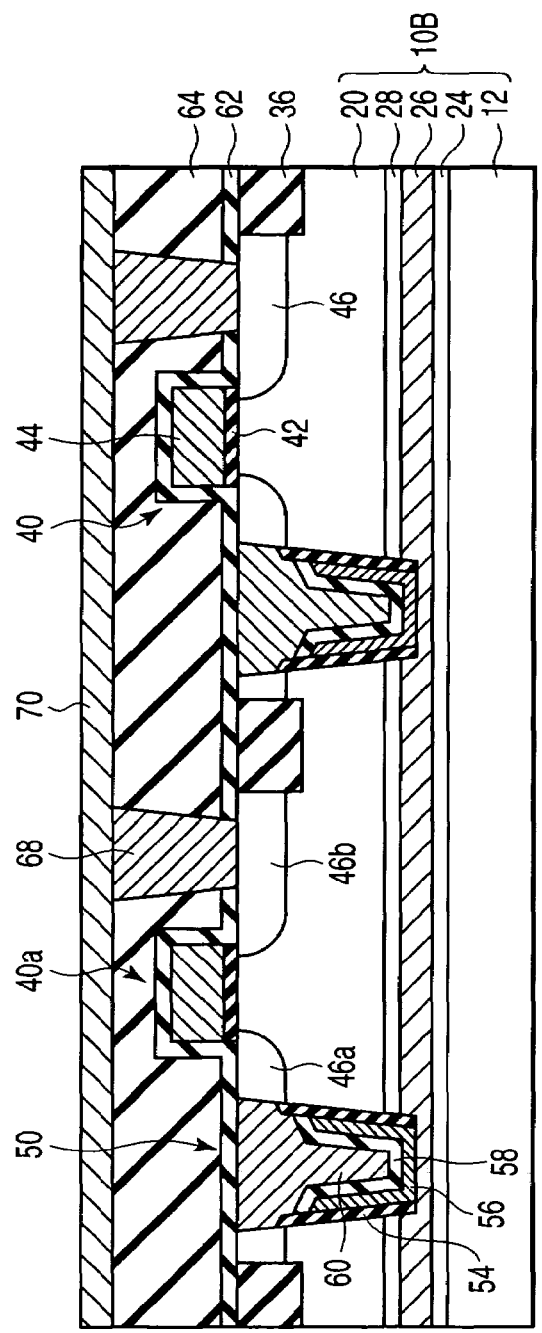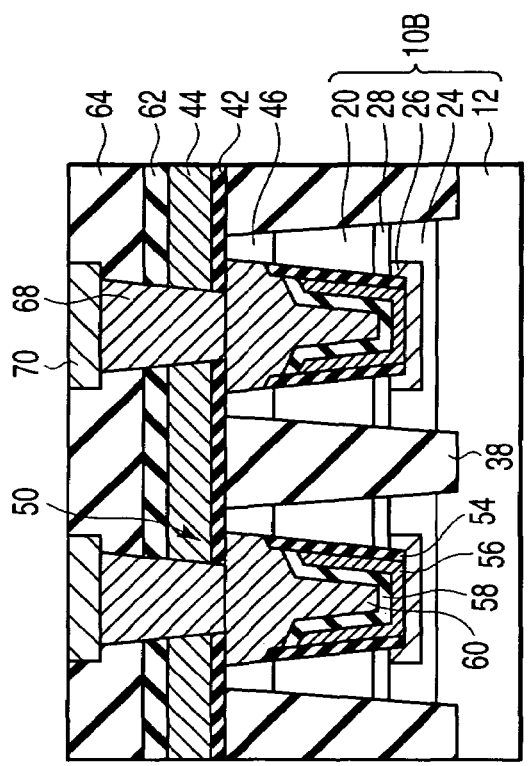
FIG.31A
FIG.31B

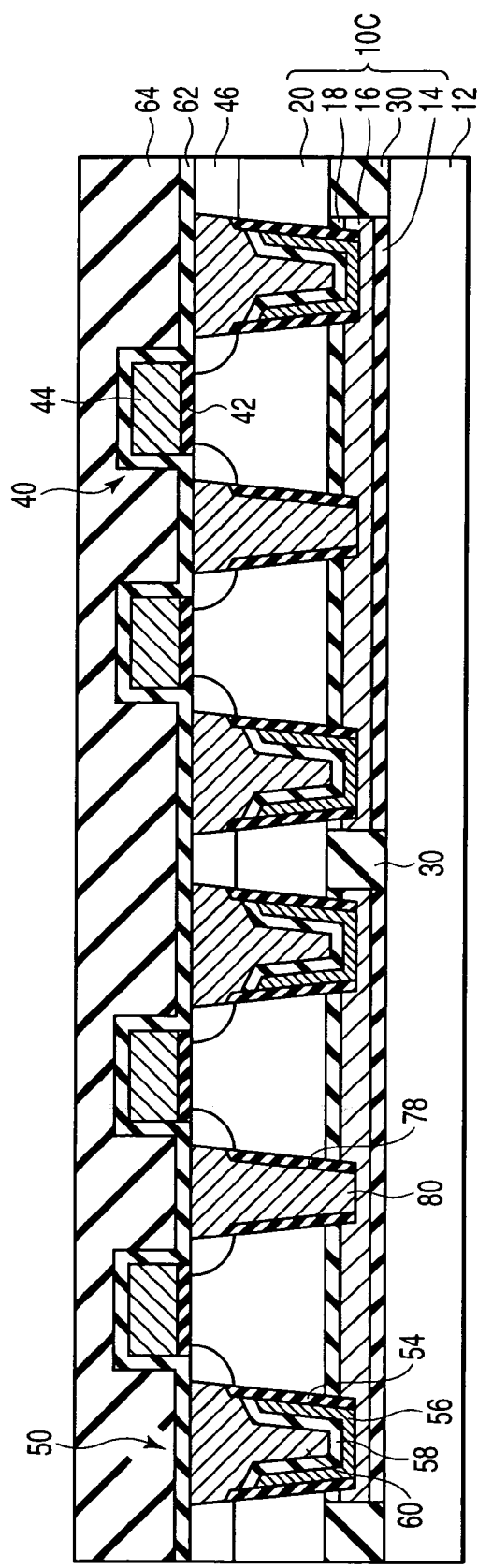
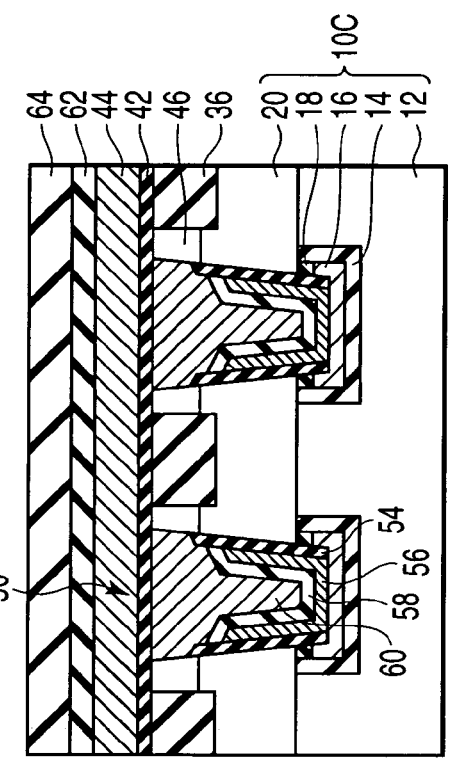
FIG. 33A
FIG. 33B

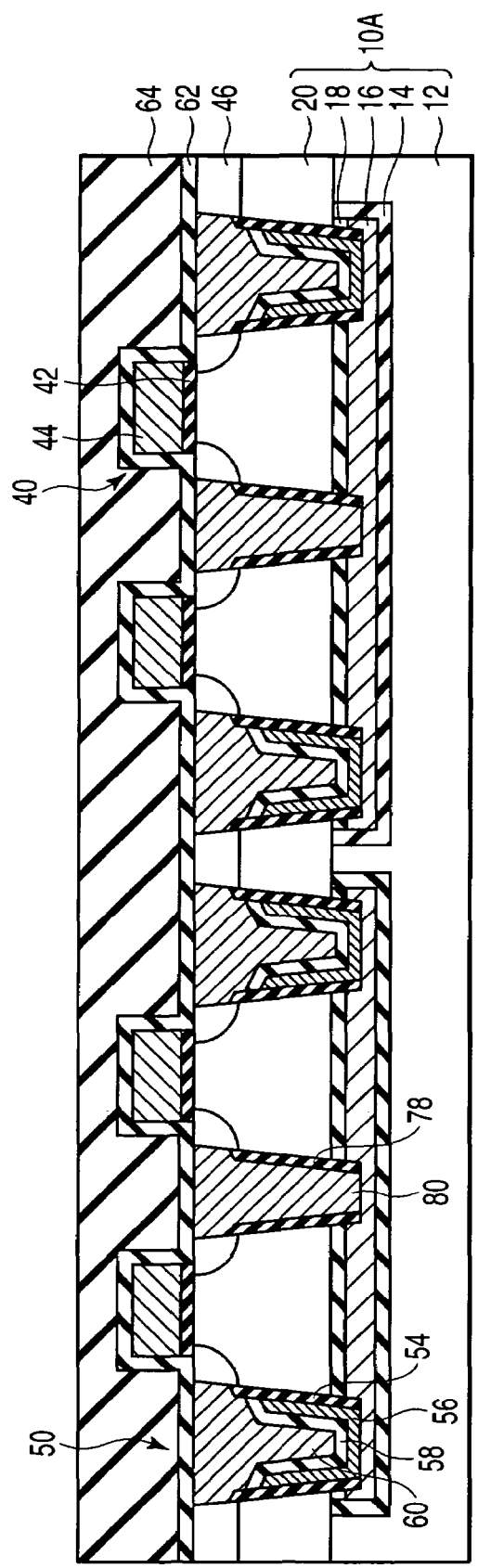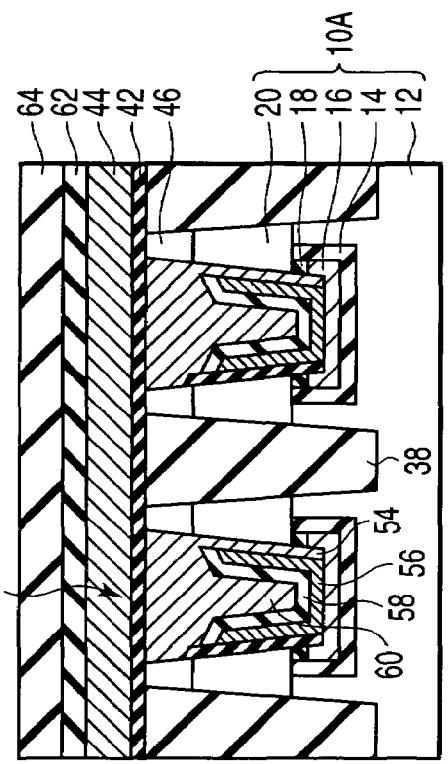
FIG. 34A
FIG. 34B

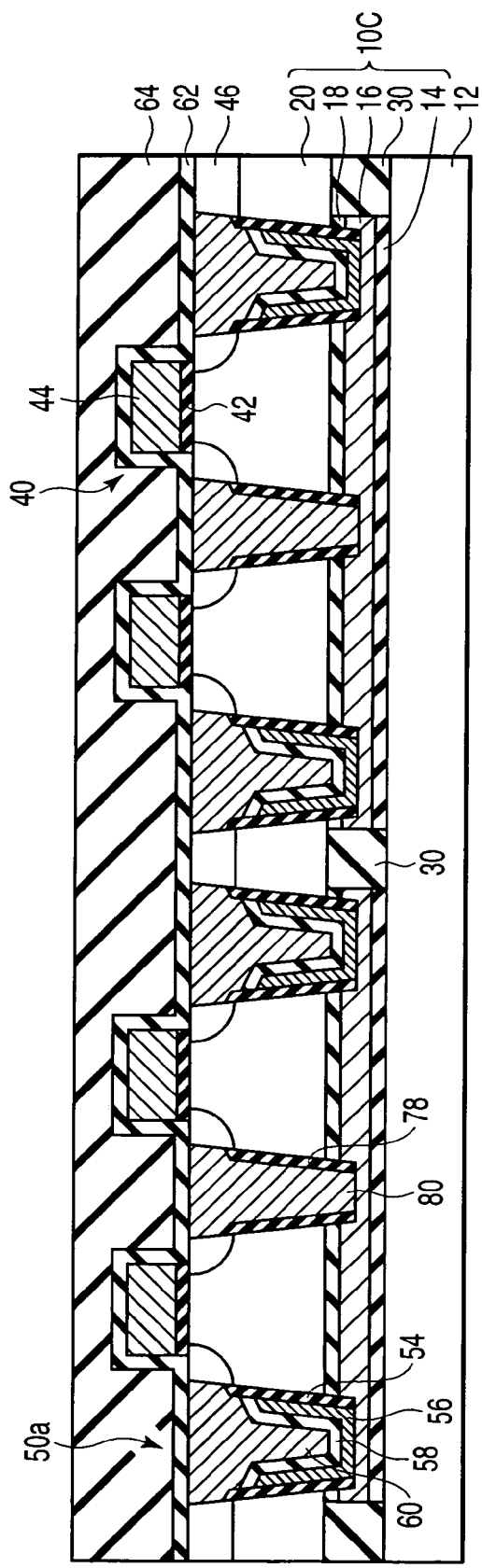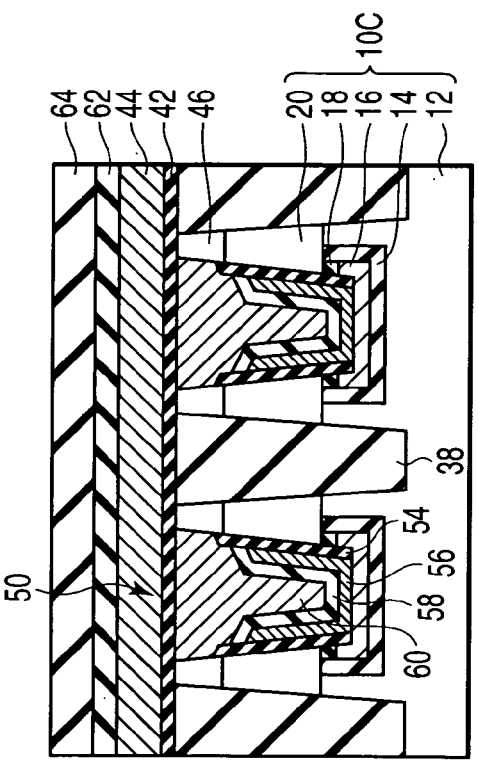
FIG. 35A
FIG. 35B

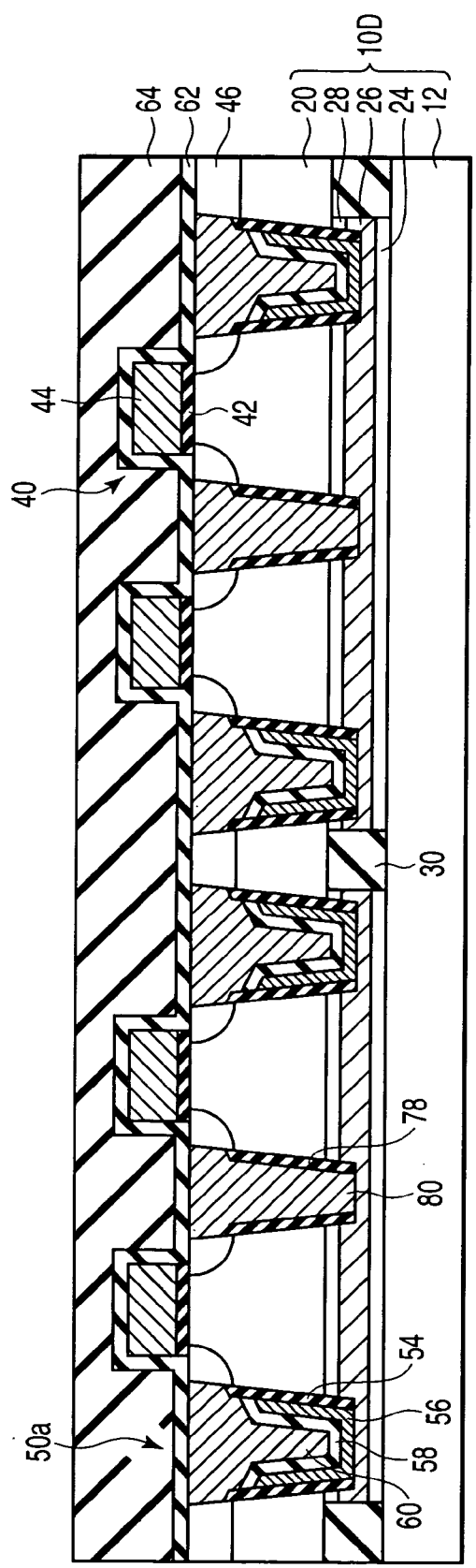
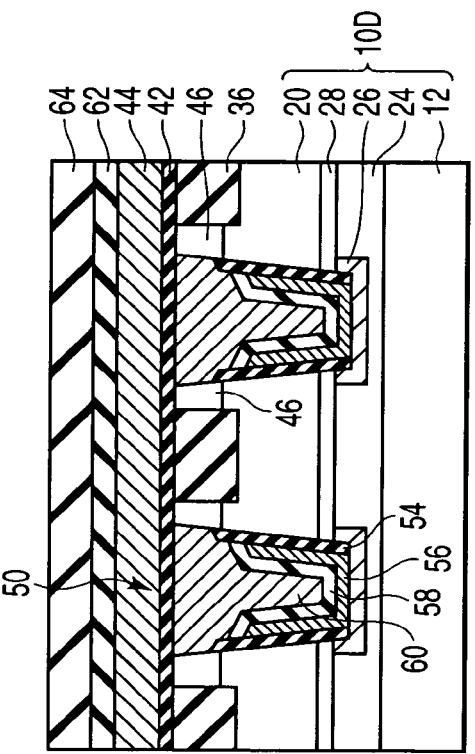
FIG. 36A
FIG. 36B

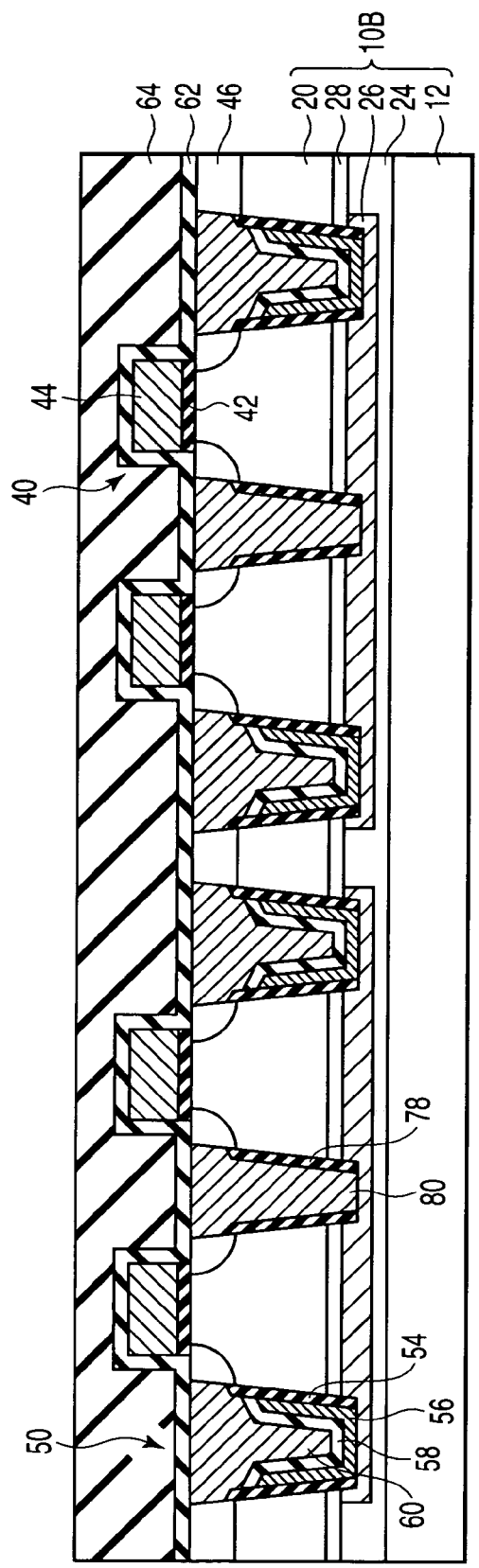
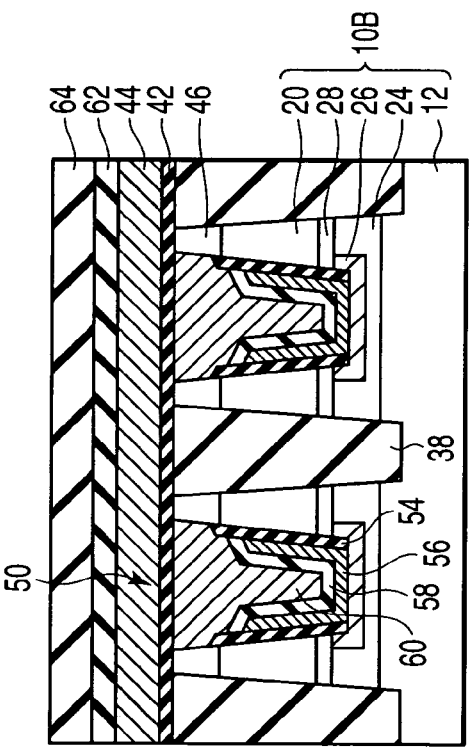
FIG.37A
FIG.37B

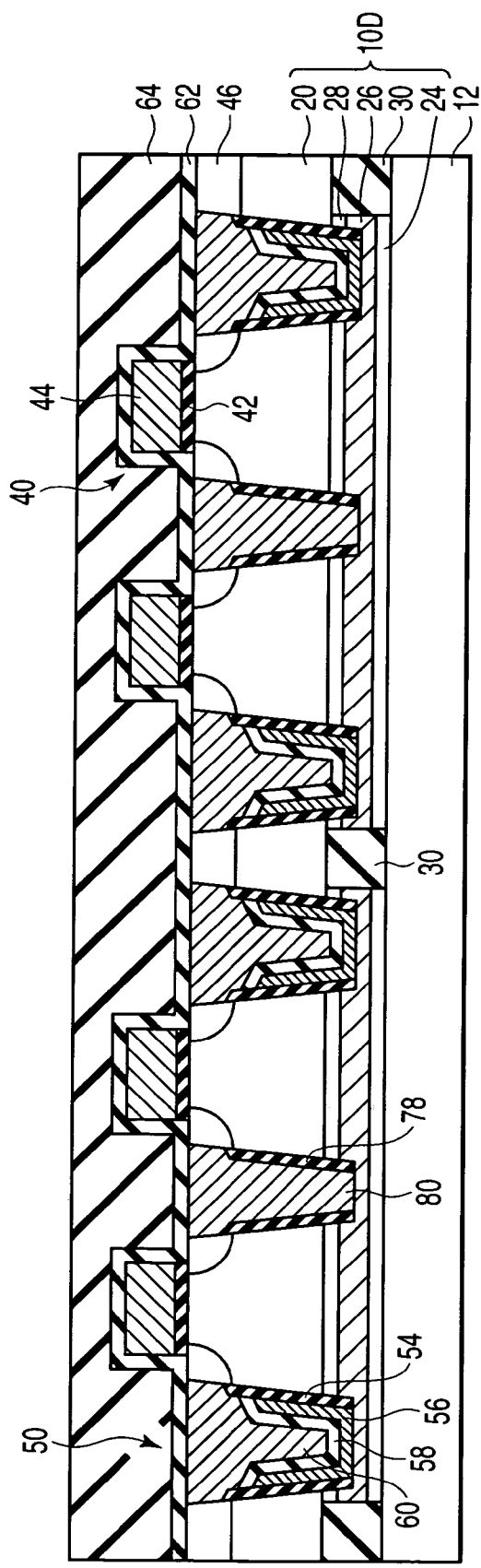
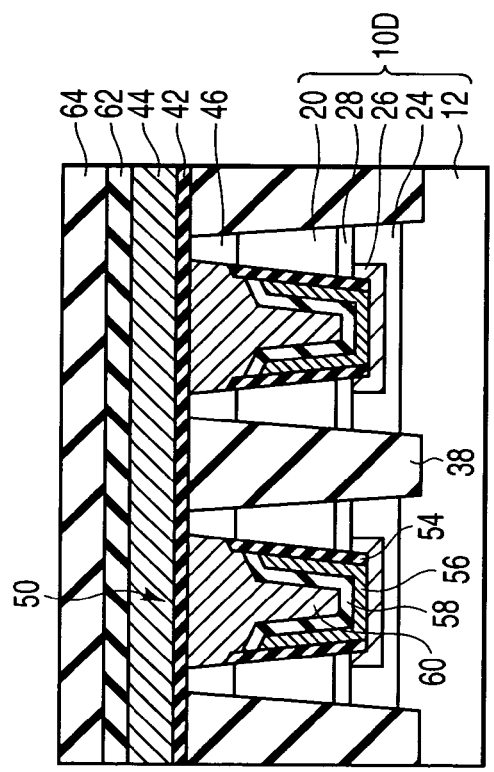
FIG. 38A
FIG. 38B

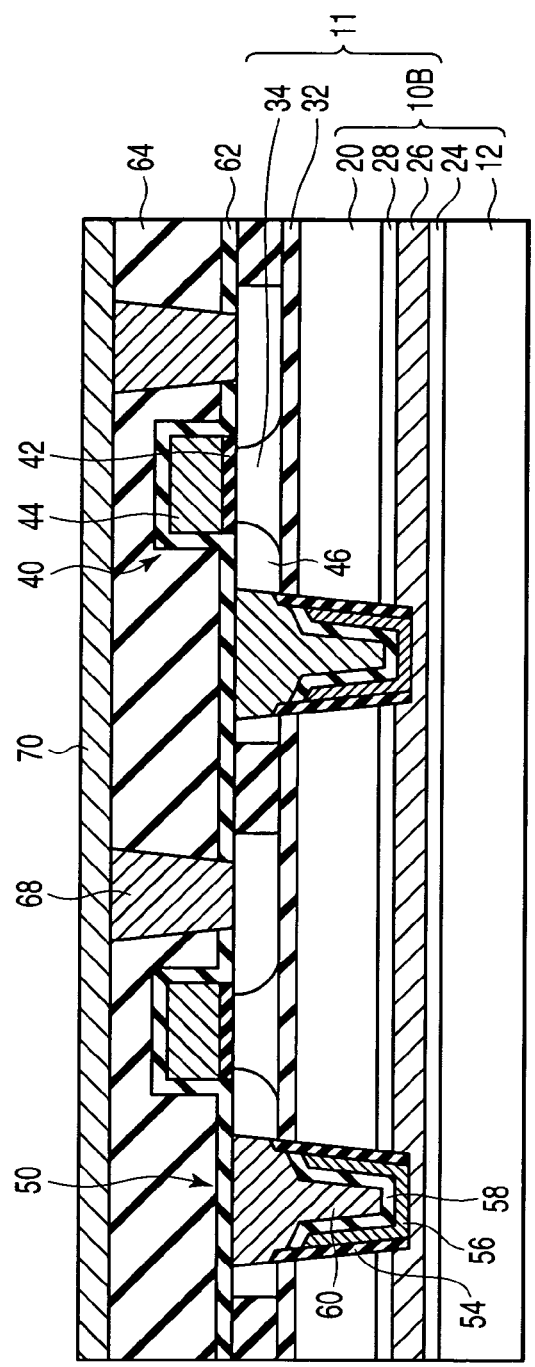
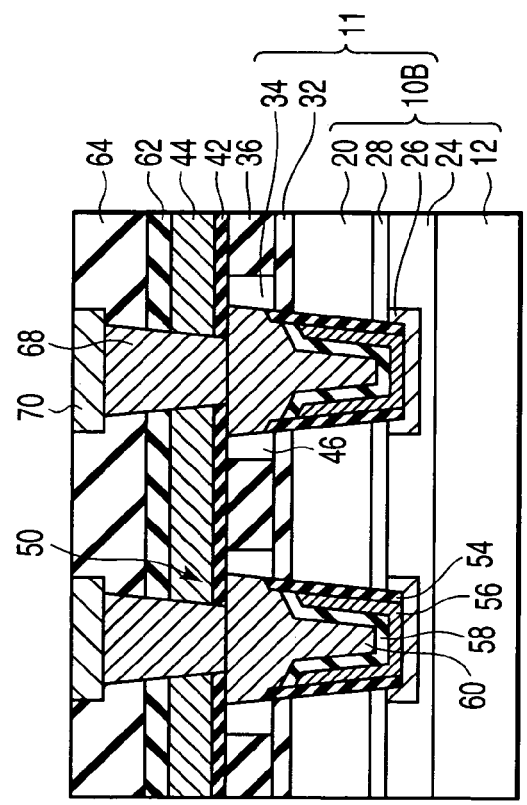
FIG. 40A
FIG. 40B

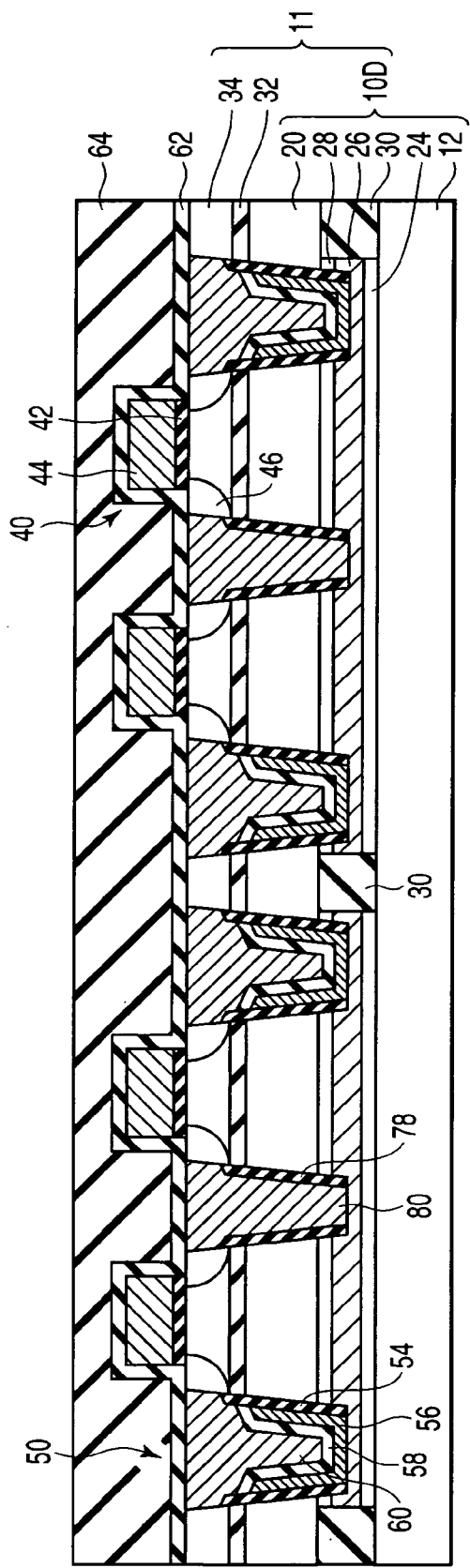
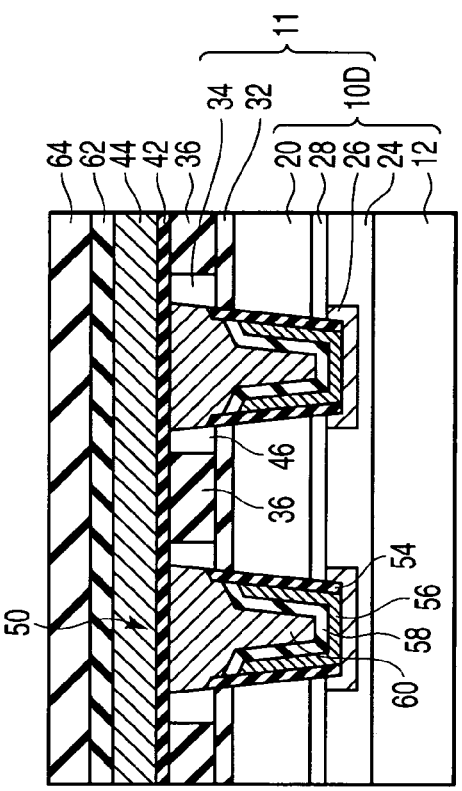
FIG. 41A
FIG. 41B

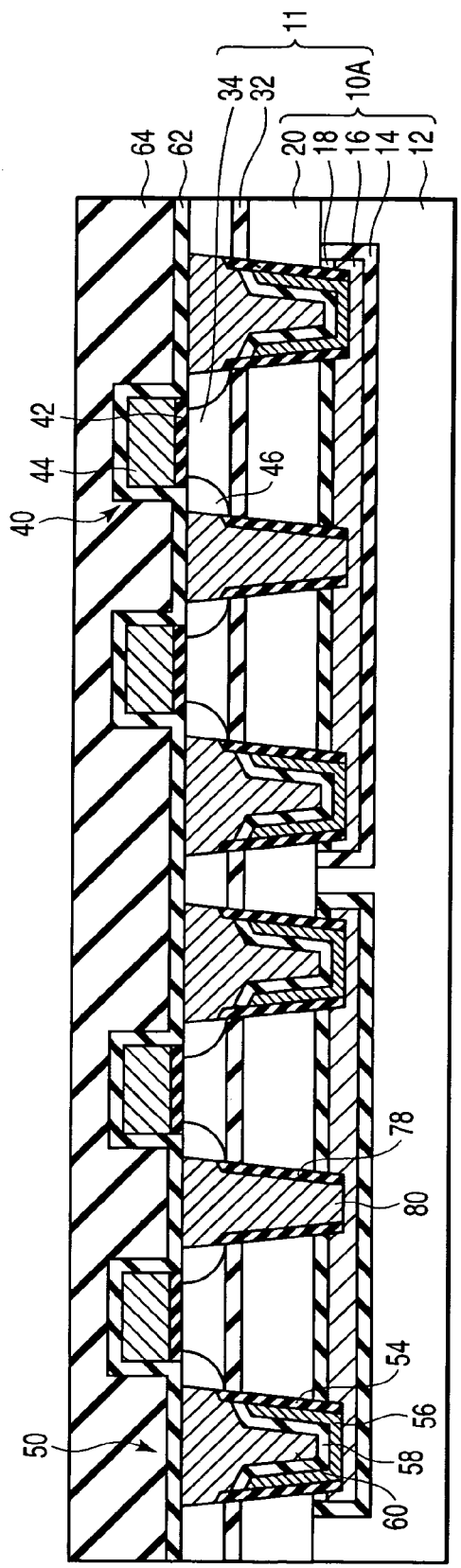
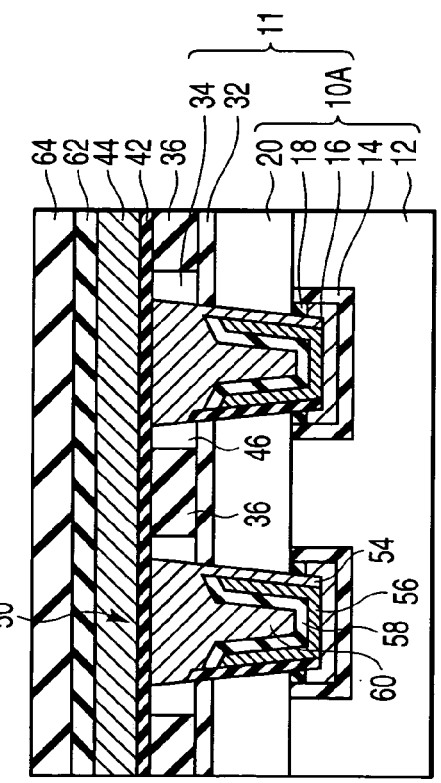
FIG. 42A
FIG. 42B

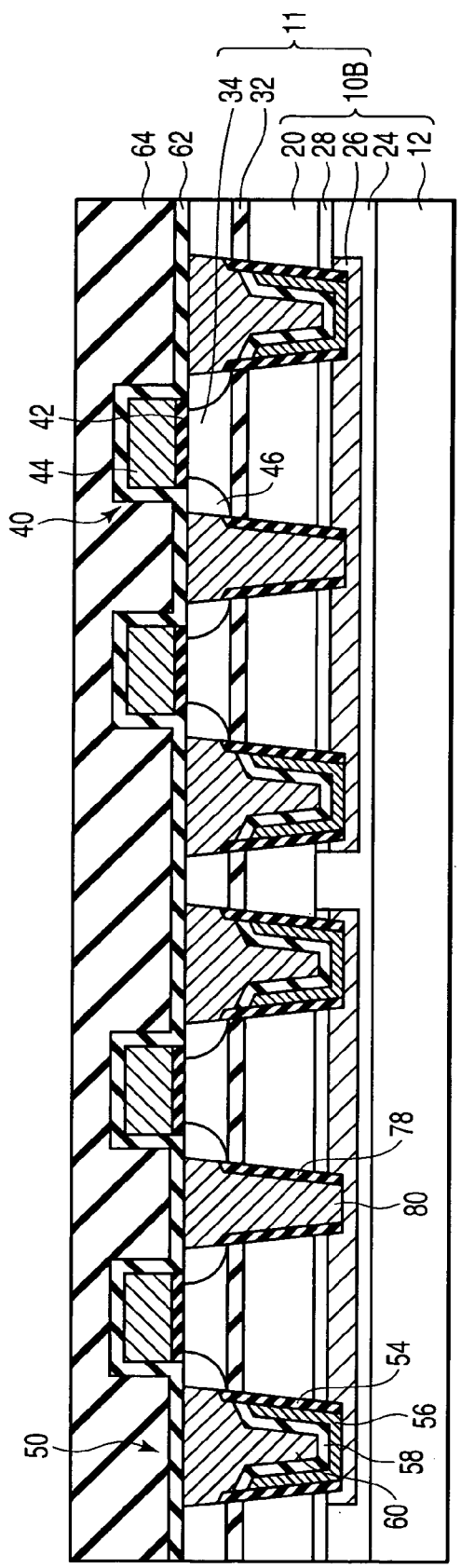
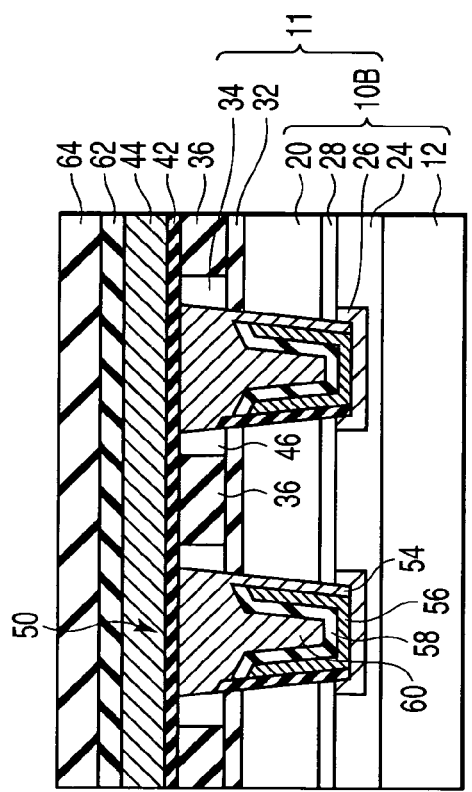
FIG. 43A
FIG. 43B

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2004-228359, filed Aug. 4, 2004, the entire contents of which are incorporated herein by reference.

BACKGROUND OF THE INVENTION

1. Field of the Invention

The present invention relates to a semiconductor memory device using a ferroelectric film, and more specifically to a semiconductor memory device which has a structure suitable for miniaturization, and its manufacturing method.

2. Description of the Related Art

Upon progress of miniaturization to realize high integration, a semiconductor memory device, such as a dynamic random access memory (DRAM), has employed a three-dimensional structure. FIGS. 44A, 44B show an example of a conventional trench type ferroelectric random access memory (FeRAM) which is one of three-dimensional structures. The drawings are illustrated to explain sectional structures. FIG. 44A shows a single trench type FeRAM, and FIG. 44B shows a serially connected trench type FeRAM. As shown in FIGS. 44A, 44B, the trench type FeRAM comprises a metal oxide semiconductor (MOS) transistor 40, and a trench ferroelectric capacitor 50 formed in one source/drain 46a of the MOS transistor and constituted of a lower electrode 56, a ferroelectric film 58, and an upper electrode 60. The upper electrode 60 of the capacitor is connected to a plate line 90 through a first contact plug 86. Additionally, in the serially connected trench type FeRAM shown in FIG. 44B, a plate line 90b is connected to the other source/drain 46b of the MOS transistor through a second contact plug 84. In this trench type FeRAM, since the contact plug 86 connected to the plate line 90 should be formed from the upper electrode 60 of the capacitor 50, this portion needs (A) a margin for processing, consequently, it imposes a limitation on miniaturization. Further, in the serially connected trench type FeRAM shown in FIG. 44B, as to trench capacitors 50a, 50b formed in the same source/drain 46a, their lower electrodes 56a, 56b are commonly connected, and their upper electrodes 60a, 60b are connected to different plate lines 90a, 90b. Securing of (B) a space between the plate lines 90a, 90b is also an obstacle to miniaturization.

FIGS. 45A, 45B show an example of a stack type FeRAM of a conventional structure which is another three-dimensional structure. The drawings are illustrated to explain sectional structures. FIG. 45A shows a single stack type FeRAM, and FIG. 45B shows a serially connected stack type FeRAM. As shown in FIGS. 45A, 45B, the stack type FeRAM comprises a MOS transistor 40, and a stacked ferroelectric capacitor 51 constituted of a columnar lower electrode 56, a ferroelectric film 58, and an upper electrode 60 formed on a first contact plug 82 on one source/drain 46a of the MOS transistor 40. The upper electrode 60 is connected to a plate line 90 through a third contact plug 86. Additionally, in the serially connected stack type FeRAM shown in FIG. 45B, a plate line 90b is connected to the other source/drain 46b of the MOS transistor 40 through a second contact plug 84. In this stack type FeRAM, miniaturization causes problems due to following micro-fabrication itself. For example, (B) a space between separate plate lines 90a, 90b, (C) alignment of the first contact plug 82 to the stacked capacitor 51, (D) a processing margin between adjacent capacitors 51, (E) etching processing of the columnar lower electrode 56, (F) processing of the contact plug 86 for connecting the plate line 90b formed above the capacitor 51 to the source/drain 46b, and the like can be cited as problems.

Furthermore, Jpn. Pat. Appln. KOKAI Publication No. 10-303396 discloses yet another FeRAM with different three-dimensional structure. The FeRAM has a flat capacitor with a ferroelectric film to suppress its characteristic deterioration caused by its three-dimensional structure. The capacitor constituted of epitaxially grown layers of a first electrode 104, a ferroelectric film 105, and a second electrode 106 is formed on a silicon wafer 101. A silicon-on-insulator (SOI) layer 109 is formed on the wafer having the capacitor via an insulator 110. A MOS transistor is formed on the SOI layer 109. The first electrode 104 of the capacitor also has a function of a plate line. This structure is suitable for miniaturization because an area below the MOS transistor can be used for the capacitor. However, there are various problems described below. The capacitor is formed on the silicon wafer 101 using an epitaxial growth. However, materials of the components of the capacitor are different from silicon. The epitaxial growth that uses such different kinds of materials, i.e., hetero-epitaxial growth, is a very sophisticated technology. To execute high-quality epitaxial growth without introducing crystal defects and so on, there are restrictions on materials to be used. In addition, a manufacturing process is complex since the SOI structure is employed.

As described above, a semiconductor device including a ferroelectric random access memory having a structure suitable for miniaturization and easy to manufacture, and having less restrictions on materials to be used, and its manufacturing method is required.

BRIEF SUMMARY OF THE INVENTION

According to one aspect of the present invention, a semiconductor memory device comprises: a field effect transistor formed on a surface area of a semiconductor wafer, a trench ferroelectric capacitor formed in the semiconductor wafer in one source/drain of the field effect transistor, wherein one electrode thereof is connected to the source/drain, and a wiring formed in the semiconductor wafer and connected to the other electrode of the trench ferroelectric capacitor.

According to another aspect of the present invention, a semiconductor memory device comprises: a field effect transistor formed on a surface area of a semiconductor wafer, a trench ferroelectric capacitor formed in the semiconductor wafer in one source/drain of the field effect transistor, wherein one electrode thereof is connected to the source/drain, a wiring formed in the semiconductor wafer and connected to the other electrode of the trench ferroelectric capacitor, and a transistor-capacitor parallel unit in which the field effect transistor and the trench ferroelectric capacitor are connected in parallel.

According to further aspect of the present invention, a method for manufacturing a semiconductor memory device comprises: forming a wiring in a semiconductor wafer, forming a semiconductor layer on the semiconductor wafer including the wiring, forming a field effect transistor on a surface area of the semiconductor layer, and forming a trench ferroelectric capacitor in the semiconductor wafer in one source/drain of the field effect transistor, wherein one electrode thereof is connected to the source/drain, and the other electrode thereof is connected to the wiring.

According to yet another aspect of the present invention, a method for manufacturing a semiconductor memory device comprises: forming a first semiconductor layer of a second conductive type in a surface area of a semiconductor wafer of a first conductive type, forming a first trench in the first semiconductor layer, forming a wiring in the first trench, forming a second semiconductor layer of the second conductive type on the wiring, forming a third semiconductor layer of the first conductive type on the semiconductor wafer including the second semiconductor layer, forming a field effect transistor in a surface area of the third semiconductor layer, forming a second trench reaching the wiring in the semiconductor wafer in one source/drain of the field effect transistor, forming an insulator on inner walls of the second trench, forming a lower electrode on the insulator being connected to the wiring, forming a ferroelectric film on the lower electrode, and forming an upper electrode on the ferroelectric film being connected to the source/drain to form a trench ferroelectric capacitor.

BRIEF DESCRIPTION OF THE SEVERAL VIEWS OF THE DRAWING

FIG. 2A is illustrated to explain a sectional structure in a direction parallel to a plate line (PL) which includes a section cut along a line 2A—2A shown in FIG. 1, and FIG. 2B is illustrated to explain a sectional structure in a direction parallel to a word line (WL) which includes a section cut along a line 2B—2B shown in FIG. 1;

FIGS. 3A, 3B are views to explain sectional structures of an example of a manufacturing process of the semiconductor device of the first embodiment: FIG. 3A is illustrated to explain a sectional structure of the direction parallel to the PL, and FIG. 3B is illustrated to explain a sectional structure of the direction parallel to the WL;

FIGS. 4A, 4B are views to explain sectional structures of the example of the manufacturing process of the semiconductor device of the first embodiment subsequent to FIGS. 3A, 3B: FIG. 4A is illustrated to explain the sectional structure of the direction parallel to the PL, and FIG. 4B is illustrated to explain the sectional structure of the direction parallel to the WL;

FIGS. 5A, 5B are views to explain sectional structures of the example of the manufacturing process of the semiconductor device of the first embodiment subsequent to FIGS. 4A, 4B: FIG. 5A is illustrated to explain the sectional structure of the direction parallel to the PL, and FIG. 5B is illustrated to explain the sectional structure of the direction parallel to the WL;

FIG. 6A is illustrated to explain the sectional structure of the direction parallel to the PL, and FIG. 6B is illustrated to explain the sectional structure of the direction parallel to the WL;

FIGS. 7A, 7B are views to explain sectional structures of the example of the manufacturing process of the semiconductor device of the first embodiment subsequent to FIGS. 6A, 6B: FIG. 7A is illustrated to explain the sectional structure of the direction parallel to the PL, and FIG. 7B is illustrated to explain the sectional structure of the direction parallel to the WL;

FIGS. 8A, 8B are views to explain sectional structures of the example of the manufacturing process of the semiconductor device of the first embodiment subsequent to FIGS. 7A, 7B: FIG. 8A is illustrated to explain the sectional structure of the direction parallel to the PL, and FIG. 8B is illustrated to explain the sectional structure of the direction parallel to the WL;

FIGS. 9A, 9B are views to explain sectional structures of the example of the manufacturing process of the semiconductor device of the first embodiment subsequent to FIGS. 8A, 8B: FIG. 9A is illustrated to explain the sectional structure of the direction parallel to the PL, and FIG. 9B is illustrated to explain the sectional structure of the direction parallel to the WL;

FIGS. 10A, 10B are views to explain sectional structures of the example of the manufacturing process of the semiconductor device of the first embodiment subsequent to FIGS. 9A, 9B: FIG. 10A is illustrated to explain the sectional structure of the direction parallel to the PL, and FIG. 10B is illustrated to explain the sectional structure of the direction parallel to the WL;

FIGS. 11A, 11B are views to explain sectional structures of the example of the manufacturing process of the semiconductor device of the first embodiment subsequent to FIGS. 10A, 10B: FIG. 11A is illustrated to explain the sectional structure of the direction parallel to the PL, and FIG. 11B is illustrated to explain the sectional structure of the direction parallel to the WL;

FIGS. 12A, 12B are views to explain sectional structures of the example of the manufacturing process of the semiconductor device of the first embodiment subsequent to FIGS. 11A, 11B: FIG. 12A is illustrated to explain the sectional structure of the direction parallel to the PL, and FIG. 12B is illustrated to explain the sectional structure of the direction parallel to the WL;

FIGS. 13A, 13B are views to explain sectional structures of the example of the manufacturing process of the semiconductor device of the first embodiment subsequent to FIGS. 12A, 12B: FIG. 13A is illustrated to explain the sectional structure of the direction parallel to the PL, and FIG. 13B is illustrated to explain the sectional structure of the direction parallel to the WL;

FIGS. 14A, 14B are views to explain sectional structures of the example of the manufacturing process of the semiconductor device of the first embodiment subsequent to FIGS. 13A, 13B: FIG. 14A is illustrated to explain the sectional structure of the direction parallel to the PL, and FIG. 14B is illustrated to explain the sectional structure of the direction parallel to the WL;

FIGS. 16A, 16B are views to explain sectional structures of an example of the semiconductor device of the second embodiment of the invention: FIG. 16A is illustrated to explain a sectional structure in a direction parallel to a PL which includes a section cut along a line 16A—16A shown in FIG. 15, and FIG. 16B is illustrated to explain a sectional structure in a direction parallel to a WL which includes a section cut along a line 16B—16B shown in FIG. 15;

FIGS. 17A, 17B are views to explain sectional structures of an example of a manufacturing process of the semiconductor device of the second embodiment: FIG. 17A is illustrated to explain a sectional structure of the direction parallel to the PL, and FIG. 17B is illustrated to explain a sectional structure of the direction parallel to the WL;

FIGS. 18A, 18B are views to explain sectional structures of the example of the manufacturing process of the semiconductor device of the second embodiment subsequent to FIGS. 17A, 17B: FIG. 18A is illustrated to explain the sectional structure of the direction parallel to the PL, and FIG. 18B is illustrated to explain the sectional structure of the direction parallel to the WL;

FIG. 19A is illustrated to explain the sectional structure of the direction parallel to the PL, and FIG. 19B is illustrated to explain the sectional structure of the direction parallel to the WL;

FIGS. 20A, 20B are views to explain sectional structures of the example of the manufacturing process of the semiconductor device of the second embodiment subsequent to FIGS. 19A, 19B: FIG. 20A is illustrated to explain the sectional structure of the direction parallel to the PL, and FIG. 20B is illustrated to explain the sectional structure of the direction parallel to the WL;

FIGS. 21A, 21B are views to explain sectional structures of the example of the manufacturing process of the semiconductor device of the second embodiment subsequent to FIGS. 20A, 20B: FIG. 21A is illustrated to explain the sectional structure of the direction parallel to the PL, and FIG. 21B is illustrated to explain the sectional structure of the direction parallel to the WL;

FIGS. 22A, 22B are views to explain sectional structures of the example of the manufacturing process of the semiconductor device of the second embodiment subsequent to FIGS. 21A, 21B: FIG. 22A is illustrated to explain the sectional structure of the direction parallel to the PL, and FIG. 22B is illustrated to explain the sectional structure of the direction parallel to the WL;

FIGS. 23A, 23B are views to explain sectional structures of the example of the manufacturing process of the semiconductor device of the second embodiment subsequent to FIGS. 22A, 22B: FIG. 23A is illustrated to explain the sectional structure of the direction parallel to the PL, and FIG. 23B is illustrated to explain the sectional structure of the direction parallel to the WL;

FIG. 24A is illustrated to explain a sectional structure in a direction parallel to a PL, and FIG. 24B is illustrated to explain a sectional structure in a direction parallel to a WL;

FIG. 25A is illustrated to explain a sectional structure of the direction parallel to the PL, and FIG. 25B is illustrated to explain a sectional structure of the direction parallel to the WL;

FIG. 26A is illustrated to explain the sectional structure of the direction parallel to the PL, and FIG. 26B is illustrated to explain the sectional structure of the direction parallel to the WL;

FIGS. 27A, 27B are views to explain sectional structures of the example of the manufacturing process of the semiconductor device of the third embodiment subsequent to FIGS. 26A, 26B: FIG. 27A is illustrated to explain the sectional structure of the direction parallel to the PL, and FIG. 27B is illustrated to explain the sectional structure of the direction parallel to the WL;

FIGS. 28A, 28B are views to explain sectional structures of the example of the manufacturing process of the semiconductor device of the third embodiment subsequent to FIGS. 27A, 27B: FIG. 28A is illustrated to explain the sectional structure of the direction parallel to the PL, and FIG. 28B is illustrated to explain the sectional structure of the direction parallel to the WL;

FIGS. 29A, 29B are views to explain sectional structures of an example of a semiconductor device according to a modification 1 of the present invention: FIG. 29A is illustrated to explain a sectional structure in a direction parallel to a PL, and FIG. 29B is illustrated to explain a sectional structure in a direction parallel to a WL;

FIGS. 30A, 30B are views to explain sectional structures of an example of a semiconductor device according to a modification 2 of the present invention: FIG. 30A is illustrated to explain a sectional structure in a direction parallel to a PL, and FIG. 30B is illustrated to explain a sectional structure in a direction parallel to a WL;

FIGS. 31A, 31B are views to explain sectional structures of an example of a semiconductor device according to a modification 3 of the present invention: FIG. 31A is illustrated to explain a sectional structure in a direction parallel to a PL, and FIG. 31B is illustrated to explain a sectional structure in a direction parallel to a WL;

FIG. 32A is illustrated to explain a sectional structure in a direction parallel to a PL, and FIG. 32B is illustrated to explain a sectional structure in a direction parallel to a WL;

FIGS. 33A, 33B are views to explain sectional structures of an example of a semiconductor device according to a modification 5 of the present invention: FIG. 33A is illustrated to explain a sectional structure in a direction parallel to a PL, and FIG. 33B is illustrated to explain a sectional structure in a direction parallel to a WL;

FIGS. 34A, 34B are views to explain sectional structures of an example of a semiconductor device according to a modification 6 of the present invention: FIG. 34A is illustrated to explain a sectional structure in a direction parallel to a PL, and FIG. 34B is illustrated to explain a sectional structure in a direction parallel to a WL;

FIGS. 35A, 35B are views to explain sectional structures of an example of a semiconductor device according to a modification 7 of the present invention: FIG. 35A is illustrated to explain a sectional structure in a direction parallel to a PL, and FIG. 35B is illustrated to explain a sectional structure in a direction parallel to a WL;

FIGS. 36A, 36B are views to explain sectional structures of an example of a semiconductor device according to a modification 8 of the present invention: FIG. 36A is illustrated to explain a sectional structure in a direction parallel to a PL, and FIG. 36B is illustrated to explain a sectional structure in a direction parallel to a WL;

FIGS. 37A, 37B are views to explain sectional structures of an example of a semiconductor device according to a modification 9 of the present invention: FIG. 37A is illustrated to explain a sectional structure in a direction parallel to a PL, and FIG. 37B is illustrated to explain a sectional structure in a direction parallel to a WL;

FIGS. 38A, 38B are views to explain sectional structures of an example of a semiconductor device according to a modification 10 of the present invention: FIG. 38A is illustrated to explain a sectional structure in a direction parallel to a PL, and FIG. 38B is illustrated to explain a sectional structure in a direction parallel to a WL;

FIG. 39A is illustrated to explain a sectional structure in a direction parallel to a PL, and FIG. 39B is illustrated to explain a sectional structure in a direction parallel to a WL;

FIGS. 40A, 40B are views to explain sectional structures of an example of a semiconductor device according to a modification 12 of the present invention: FIG. 40A is illustrated to explain a sectional structure in a direction parallel to a PL, and FIG. 40B is illustrated to explain a sectional structure in a direction parallel to a WL;

FIGS. 41A, 41B are views to explain sectional structures of an example of a semiconductor device according to a modification 13 of the present invention: FIG. 41A is illustrated to explain a sectional structure in a direction parallel to a PL, and FIG. 41B is illustrated to explain a sectional structure in a direction parallel to a WL;

FIGS. 42A, 42B are views to explain sectional structures of an example of a semiconductor device according to a modification 14 of the present invention: FIG. 42A is illustrated to explain a sectional structure in a direction parallel to a PL, and FIG. 42B is illustrated to explain a sectional structure in a direction parallel to a WL;

FIGS. 43A, 43B are views to explain sectional structures of an example of a semiconductor device according to a modification 15 of the present invention: FIG. 43A is illustrated to explain a sectional structure in a direction parallel to a PL, and FIG. 43B is illustrated to explain a sectional structure in a direction parallel to a WL;

FIG. 44A showing a single trench type FeRAM, and FIG. 44B showing a serially connected trench type FeRAM; FIG. 45A showing a single stack type FeRAM, and FIG. 45B showing a serially connected stack type FeRAM.

DETAILED DESCRIPTION OF THE INVENTION

Figure 1:
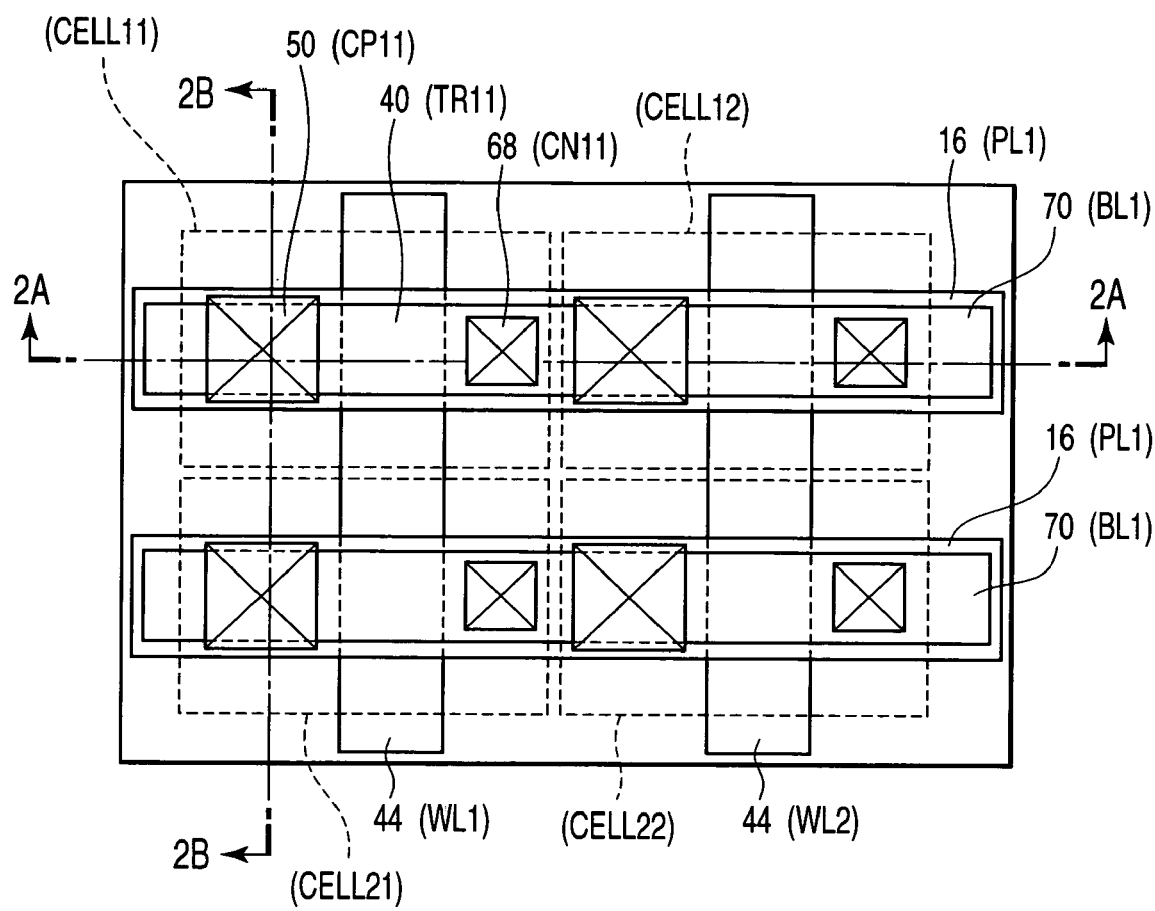
FIG. 1 is a plan view showing an example of a semiconductor device according to a first embodiment of the present invention.

The present invention provides a semiconductor memory device wherein the problem regarding the miniaturization is solved by forming a plate line in a semiconductor wafer, e.g., a silicon wafer, thereby facilitating miniaturization, and its manufacturing method.

Hereinafter, some embodiments of the present invention will be described in detail with reference to the accompanying drawings. Corresponding portions are denoted by similar reference numerals throughout the drawings.

(First Embodiment)

A first embodiment will be described with reference to FIG. 1 and FIGS. 2A, 2B. According to the first embodiment, each single trench type ferroelectric random access memory (FeRAM) is formed by using a semiconductor wafer 10A. In the semiconductor wafer 10A, a plate line (PL) 16 is formed to be surrounded with insulators 14, 18.

Figures 2A, 2B:
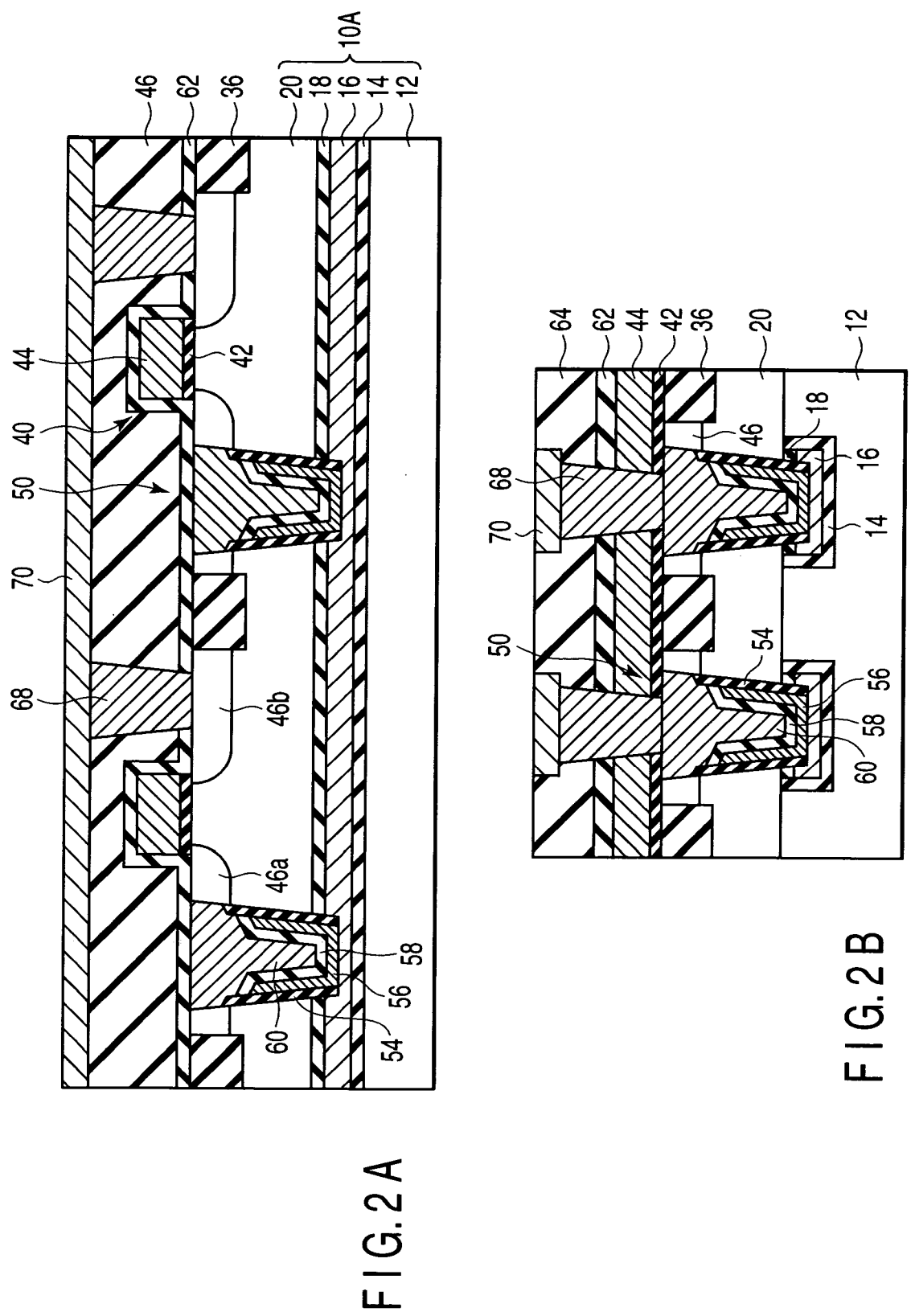
FIGS. 2A, 2B are views to explain sectional structures of an example of the semiconductor device of the first embodiment of the invention.

FIG. 1 is a plan view of the trench type FeRAM of the embodiment. FIGS. 2A, 2B are views to explain sectional structures thereof. FIG. 2A is illustrated to explain a sectional structure in a direction along a plate line (PL) 16, which is indicated by a cut line 2A—2A in FIG. 1. FIG. 2B is illustrated to explain a sectional structure in a direction of a word line (WL) 44 perpendicular to the PL 16, which is indicated by a cut line 2B—2B in FIG. 1. In FIG. 2B, a trench ferroelectric capacitor 50, a contact plug 68, and a gate electrode 44 (WL) are formed on sections different from one another in a direction perpendicular to a paper surface, but they are simultaneously shown for convenience (similar in drawings below).

Figure 44A:
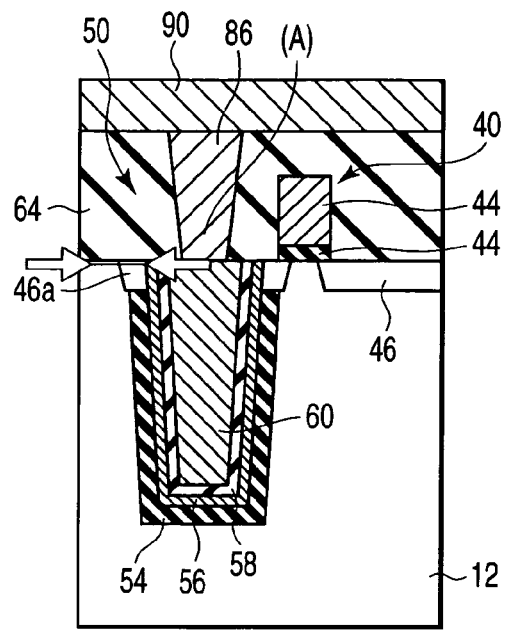
FIGS. 44A, 44B are views to explain sectional structures of an example of a semiconductor device which comprises a trench type FeRAM according to a conventional art.
Figure 44B:
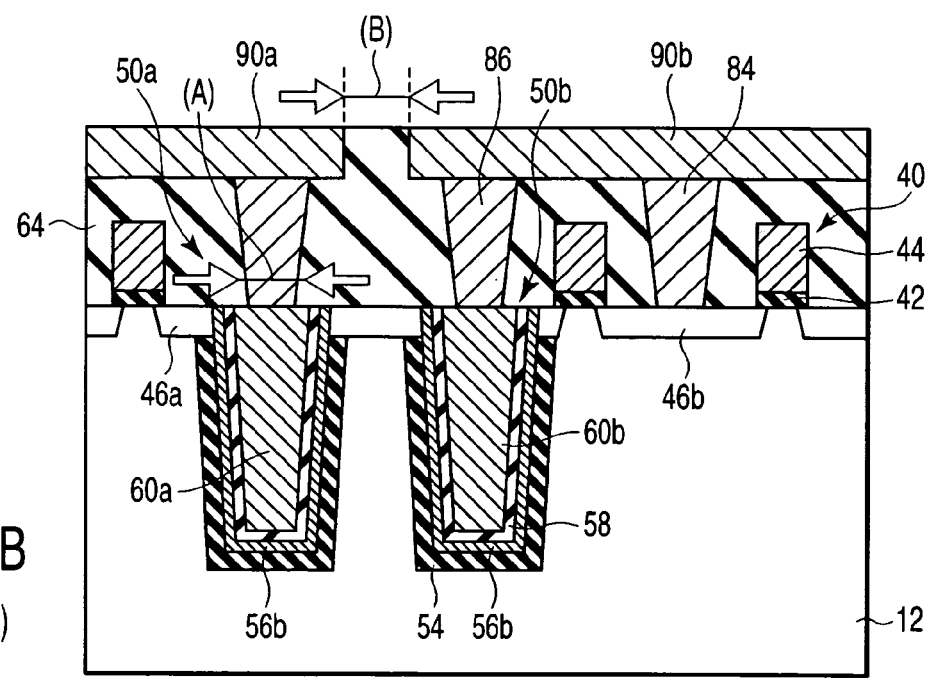
Figure 45A:
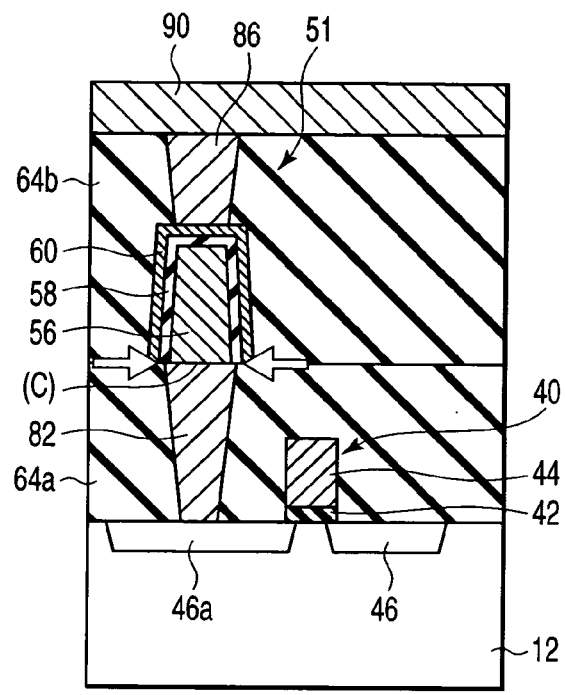
FIGS. 45A, 45B are views to explain sectional structures of an example of a semiconductor device which comprises a stack type FeRAM according to a conventional art.
Figure 45B:
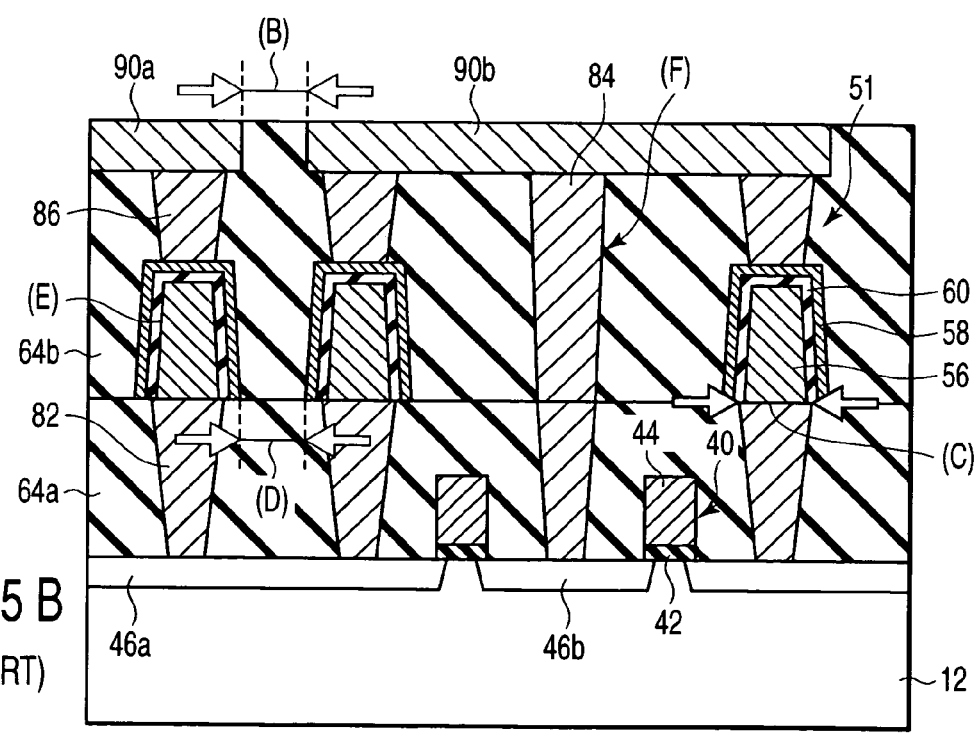

FIG. 1 shows four capacitor cells, CELL 11, 12, 21, and 22. Each capacitor cell (e.g., CELL 11) includes one MOS transistor 40 (TR 11) and one capacitor 50 (CP 11). As shown in FIG. 2A, the trench ferroelectric capacitor 50 is formed in one source/drain 46a of the MOS transistor 40. A lower electrode 56 of the capacitor 50 is directly connected to the PL 16 formed in the semiconductor wafer 10A. The contact plug (CN) 68 is formed on the other source/drain 46b of the MOS transistor 40 being connected to a bit line (BL) 72 to be formed above the semiconductor wafer 10A. The lower electrodes 56 of the capacitors 50 (CP 11, 12, . . . ) are connected commonly to the PL 16 formed in the semiconductor wafer 10A, as shown in FIGS. 2A, 2B. The BL 70 is disposed above the semiconductor wafer 10A in a direction parallel to the PL 16, and connected to the contact plugs 68 (CN 11, 12, . . . ) in common. According to this structure, the lower electrode 56 of the trench ferroelectric capacitor 50 is directly connected to the PL 16. Therefore, contact plug for connection used in the conventional art (e.g., contact plug 86 shown in FIGS. 44B, 45B) does not need to be formed, thus the structure is suitable for miniaturization.

A manufacturing process of the semiconductor device of the first embodiment will be described with reference to FIGS. 3A to 14B. As in the case in FIGS. 2A, 2B, the drawings are illustrated to explain sectional structures. All components are not necessary to be presented on the same section, but they are shown in the same drawing for convenience as described above. Each drawing A of FIGS. 3A to 14A illustrates the sectional structure in a direction parallel to the PL. Each drawing B of FIGS. 3B to 14B illustrates the sectional structure in a direction parallel to the WL, which is perpendicular to that of the drawing A.

(1) To begin with, a semiconductor wafer 10A with a buried PL 16 insulated from a substrate wafer 12 by insulators 14, 18 is formed.

Specifically, as shown in FIGS. 3A, 3B, a trench 16t for PL to form a PL is formed in the substrate wafer 12 which is a starting material, e.g., a silicon wafer, by lithography and etching. Then, as shown in FIGS. 4A, 4B, a first insulator 14, e.g., silicon oxide ($SiO_2$) film, is formed on an entire surface of the substrate wafer 12 by thermal oxidation, and inner surfaces of the PL trench 16t are covered with the first insulator 14. Subsequently, a PL material 16 is deposited on an entire surface of the substrate wafer 12 to fill the PL trench 16t. For the PL material, e.g., polysilicon, doped with a high concentration of impurities such as phosphorus or boron, or a high-melting point metal, such as molybdenum (Mo) or tungsten (W), can be used.

Figure 6A:
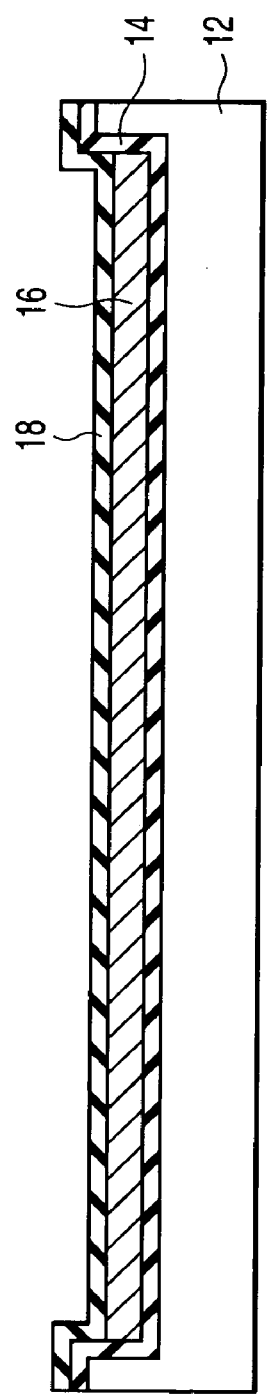
FIGS. 6A, 6B are views to explain sectional structures of the example of the manufacturing process of the semiconductor device of the first embodiment subsequent to FIGS. 5A, 5B.
Figure 6B:
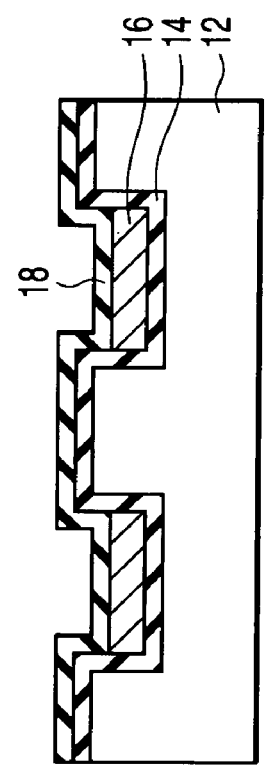

Next, a deposited wiring material on the surface other than the PL trench 16t is removed by, e.g., chemical-mechanical planarization (CMP). Simultaneously, planarization is executed, whereby the PL 16 shown in FIGS. 5A, 5B can be formed. Further, as shown in FIGS. 6A, 6B, a surface of the PL 16 is etched back, and then a second insulator 18 is formed on an entire surface to cover the PL 16. As the second insulator 18, $SiO_2$ film or silicon nitride (SiN) film formed by, e.g., chemical vapor deposition (CVD), can be used. Then, as shown in FIGS. 7A, 7B, the first and second insulators 14, 18 formed on the silicon substrate wafer 12 except for on the PL 16 are removed to expose the surface of the silicon substrate wafer 12.

Next, a single crystal silicon epitaxial layer 20 is grown with a predetermined thickness on an entire surface of the silicon substrate wafer 12 by epitaxial growth. Thus, the semiconductor wafer 10A shown in FIGS. 8A, 8B, in which the buried PL 16 insulated from the substrate by the insulators 14, 18, can be formed. Since the PL 16 is actually narrow, a good single crystal silicon epitaxial layer 20 is also grown on the insulators 14, 18 which cover the PL 16.

(2) Next, a MOS transistor 40 is formed on the semiconductor wafer 10A. As shown in FIGS. 9A, 9B, an isolation 36 is formed in the semiconductor wafer 10A, and a gate insulator 42 is formed on the entire surface. For the isolation 36, e.g., a shallow trench isolation (STI), in which a narrow trench is formed in the wafer 10A and this trench is filled with an insulator, can be applied. For the gate insulator 42, e.g., silicon oxide ($SiO_2$) film, SiN film, silicon oxynitride (SiON) film, or a high dielectric constant insulator such as tantalum oxide ($Ta_2O_5$) film, having higher dielectric constant than that of $SiO_2$ film, can be used.

A conductive material, such as polysilicon film doped with a high concentration of phosphorus (P) or boron (B), is deposited on the gate insulator 42 to form a gate electrode 44. The polysilicon film is processed by lithography and etching to form the gate electrode 44. For the gate electrode 44, in addition to the polysilicon, e.g., a high-melting point metal such as tungsten (W) or molybdenum (Mo), or silicide of such a metal, can be used. In the capacitor cell, the gate electrode 44 connects the MOS transistors 40 in a vertical direction as shown in FIG. 1, and works as a word line (WL) 44. Subsequently, using the gate electrode 44 as a mask, source/drain 46 is formed by ion implantation and annealing.

Thus, the MOS transistor 40 can be formed on the semiconductor wafer 10A.

(3) Then a trench ferroelectric capacitor 50 is formed in one source/drain 46a of the MOS transistor 40.

Specifically, as shown in FIGS. 10A, 10B, a capacitor trench 52 with a depth reaching the PL 16 is formed in the source/drain 46a. An inner wall of the trench 52 is covered with a trench sidewall insulator 54. For the trench sidewall insulator 54, e.g., $SiO_2$ film formed by thermal oxidation can be used. In addition, CVD-$SiO_2$ film, SiN film, aluminum oxide ($Al_2O_3$) film, hafnium oxide ($HfO_2$) film, strontium titanate ($SrTiO_3$) film or the like can be used.

To remove an upper part of the trench sidewall insulator 54, the trench 52 is filled with a resist (not shown), then an upper part of the resist is removed by a depth shallower than a diffusion depth of the source/drain 46. Using the resist as a mask, the upper part of the trench sidewall insulator 54 in the capacitor trench 52 is removed. The resist is removed from the trench 52, then the trench sidewall insulator 54 is removed from a bottom of the trench 52 by anisotropic dry etching.

Next, a material for a lower electrode 56 of the ferroelectric capacitor 50 is deposited on the trench sidewall insulator 54 in the trench 52. Since the insulator 54 has been removed from the bottom of the trench 52, the lower electrode 56 is directly connected with the PL 16. For the lower electrode 56, e.g., a material containing iridium (Ir), iridium oxide ($IrO_2$), ruthenium (Ru), ruthenium oxide ($RuO_2$), or platinum (Pt) can be used. Then, as in the case of removing the upper part of the trench sidewall insulator 54, an upper part of the lower electrode 56 is etched off to form a shape as shown in FIGS. 11A, 11B. The etching-off of the lower electrode 56 is carried out until the upper part of the trench sidewall insulator 54 is exposed.

Then, a ferroelectric film 58 is deposited on the lower electrode 56 in the trench 52. For the ferroelectric film 58, a metal oxide with a perovskite structure, e.g., zirconium lead titanate (PZT) or strontium bismuth tantalate (SBT), can be used. An upper part of the ferroelectric film 58 is etched off as in the case of the lower electrode 56. As a result of the etching-off, the upper end of the ferroelectric film 58 is brought into contact with the trench sidewall insulator 54 as shown in FIGS. 11A, 11B.

Then, an upper electrode 60 is deposited to fill the trench 52, and a surface is planarized by etching-back. The upper electrode 60 is brought into contact with the source/drain 46a above the trench sidewall insulator 54. For the upper electrode 60, e.g., a material containing Ir, $IrO_2$, Ru, $RuO_2$, or Pt can be used. Thus, as shown in FIGS. 12A, 12B, the trench ferroelectric capacitor 50 is formed in which the upper electrode 60 is directly connected to the source/drain 46a and the lower electrode 56 is also directly connected to the PL 16.

(4) Next, a hydrogen barrier film 62 and an interlevel insulator 64 are formed on the semiconductor wafer 10A.

Before forming such insulators, annealing is executed in an atmosphere containing oxygen, and damages in the ferroelectric film 58 caused during the formation of the trench ferroelectric capacitor 50 are recovered. Then, as shown in FIGS. 13A, 13B, the hydrogen barrier film 62 is formed on an entire surface. For the hydrogen barrier film 62, e.g., $Al_2O_3$, SiN, SiON, titanium oxide ($TiO_2$) or the like can be used. Further, the interlevel insulator 64 is formed on an entire surface of the hydrogen barrier film 62, and planarized by, e.g., CMP, to form a structure shown in FIGS. 13A, 13B.

(5) Next, a BL 70 to be connected to the other source/drain 46b of the MOS transistor 40 is formed.

Specifically, as shown in FIGS. 14A, 14B, a contact hole 68h is formed in the interlevel insulator 64 and the hydrogen barrier film 62 on the source/drain 46b, and a BL trench 70t is formed in the interlevel insulator 64, by lithography and etching. The contact hole 68 and the BL trench 70t are filled by depositing a wiring material, e.g., phosphorus-doped polysilicon or W. Then, a surface is planarized by, e.g. CMP, so that the wiring material deposited on the surface other than the BL trench 70t is simultaneously removed. Thus, the BL 70 and the contact plug 68 connecting the BL 70 to the source/drain 46b are formed.

Subsequently, a process such as multilevel wiring necessary for the semiconductor device is carried out to complete the semiconductor device which includes the FeRAM.

Therefore, the single trench type FeRAM can be formed in the semiconductor wafer 10A having the buried PL 16 insulated from the substrate by the insulators.

According to the embodiment, the semiconductor device including the FeRAM having a structure suitable for miniaturization and easy to manufacture, and having less restrictions on materials to be used is formed. Specifically, as the PL 16 is directly connected to the lower electrode 56 of the trench ferroelectric capacitor 50, and the upper electrode 60 is also directly connected to the source/drain 46, and thus forming of the contact plug on the source/drain 46 is unnecessary. Further, since the PL 16 is formed in the semiconductor wafer 10A, the BL 70 formed above the wafer 10A can be formed in positions overlapping each other in a plane. Accordingly, this structure is suitable for high-integration. Regarding materials to be used in the embodiment, materials similar to those for the conventional planar or trench type FeRAM can be used.

(Second Embodiment)

Figure 15:
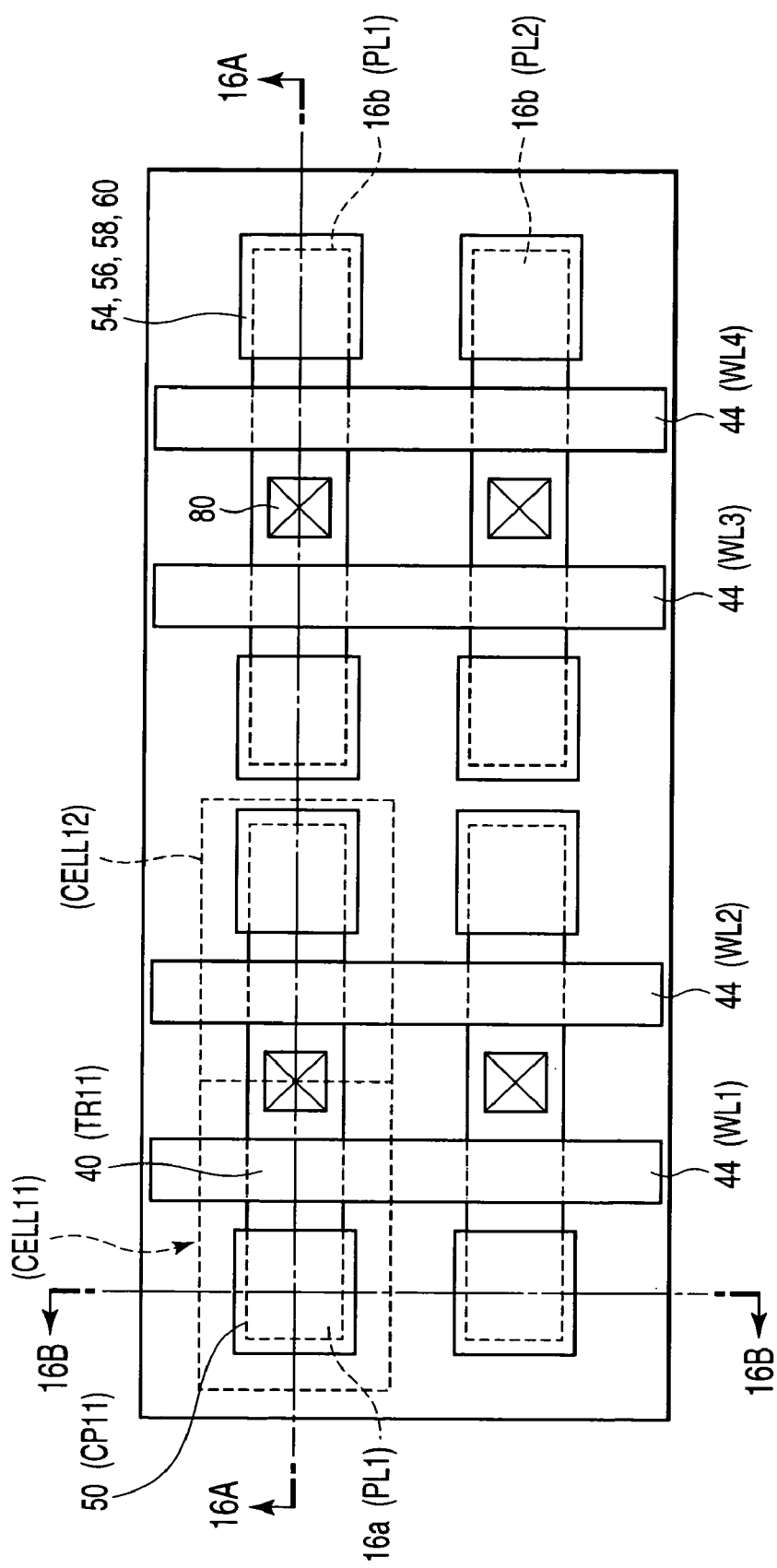
FIG. 15 is a plan view showing an example of a semiconductor device according to a second embodiment of the present invention.

A second embodiment will be described with reference to FIG. 15 and FIGS. 16A, 16B. According to the second embodiment, a trench type ferroelectric random access memory (FeRAM) with a transistor-capacitor (TC) parallel unit serial connection type is formed by using a semiconductor wafer 10B. In the semiconductor wafer 10B, a plate line (PL) 26 is formed to be insulated from the substrate wafer 12 by pn-junction. FIG. 15 is a plan view of a trench type FeRAM of the embodiment. FIG. 16A is illustrated to explain a sectional structure in a direction along a plate line (PL) 26, which is indicated by a cut line 16A—16A shown in FIG. 15. FIG. 16B is illustrated to explain a sectional structure in a direction parallel to a word line (WL) 44 perpendicular to the PL 26, which is indicated by a cut line 16B—16B shown in FIG. 15.

FIG. 15 shows eight TC parallel unit cells, and only two unit cells (CELL 11, 12) are surrounded with dotted lines. Each TC parallel unit cell (e.g., CELL 11) includes one MOS transistor (TR 11) and one trench ferroelectric capacitor (CP 11), which are connected in parallel. As shown in FIG. 16A, each source/drain 46 of MOS transistors 40 excluding both ends arrayed in a direction of the PL 26 is shared with two MOS transistors 40 on both sides. In each sources/drains 46 on both ends, one trench ferroelectric capacitor 50 is formed. In each odd-numbered source/drain 46 in the inside thereof, two trench ferroelectric capacitors 50 are formed. And in each even-numbered source/drain 46, a trench contact 80 is formed to connect that source/drain to the PL 26. In addition, for the trench ferroelectric capacitors 50 of (2n−1)-th and 2n-th, lower electrodes 56(2n−1), 56(2n) are connected to an n-th PL 26, PL 26n, where n is an integer. The PL 26n is also connected to an n-th trench contact 80.

For example, as shown in FIG. 16A, a trench ferroelectric capacitor 50a is formed in one source/drain 46a of a MOS transistor 40a, and its upper electrode 60a is connected to the source/drain 46a. A lower electrode 56a of the capacitor 50a is directly connected to a PL 26a formed in the semiconductor wafer 10B. The other source/drain 46b of the MOS transistor 40a is connected to the PL 26a through a trench contact 80. In the trench type FeRAM with the TC parallel unit serial connection type, the unit cells are serially connected.

Referring to FIG. 16A, the serial connection will be described below. That is, MOS transistors 40a and 40b share one source/drain 46b. Further, MOS transistors 40b and 40c share one source/drain 46c. A lower electrode 56a of a trench ferroelectric capacitor 50a formed in the source/drain 46a and a lower electrode 56b of a trench ferroelectric capacitor 50b formed in the source/drain 46c are connected in common to a PL 26a. Each PL 26n only connects two trench ferroelectric capacitors 50(2n−1) and 50(2n), as described above. The lower electrodes 56c and 56d of the trench ferroelectric capacitors 50c and 50d are connected in common to another PL 26b insulated from the PL 26a. Additionally, upper electrodes 60b and 60c of the trench ferroelectric capacitors 50b and 50c are directly connected in common to the source/drain 46c of the MOS transistor 40b. This source/drain 46c is shared by the MOS transistors 40b and 40c. Thus, the trench capacitor 50a, the MOS transistor 40a, the MOS transistor 40b, the trench capacitor 50b, the trench capacitor 50c, and the MOS transistor 40c are serially connected. By repeating this connection, the FeRAM with the TC parallel unit serial connection type is formed.

A manufacturing process of the semiconductor device of the second embodiment will be described with reference to FIGS. 17A to 23B. As in the cases in FIGS. 2A, 2B, the drawings are illustrate to explain sectional structures. All components are not necessarily to be presented on the same section, but they are shown in the same drawing for convenience. Each drawing A of FIGS. 17A to 23A illustrates the sectional structure in a direction parallel to the PL. Each drawing B of FIGS. 17B to 23B illustrates the sectional structure in a direction parallel to the WL, which is perpendicular to that of the drawing A.

(1) To begin with, a semiconductor wafer 10B is formed to bury a PL 26. As described above, each PL 26 is isolated short from one another to be connected only two trench ferroelectric capacitors 50 formed in two separate sources/drains 46.

Specifically, as shown in FIGS. 17A, 17B, in a substrate wafer 12 as a starting material, e.g., a silicon wafer, a first p+ silicon layer 24 doped with a high concentration of, e.g., boron, is formed to insulate a PL being formed from the wafer. The first p+ silicon layer 24 can be formed, e.g., by thermal diffusion or by p+ doped amorphous silicon deposition followed by solid-phase epitaxial growth to make the p+ doped amorphous silicon to single crystal silicon. In the first p+ silicon layer 24, a short PL trench 26t to form a divided PL 26 is formed by lithography and etching.

Next, as shown in FIGS. 18A, 18B, an n+ silicon layer 26 doped with a high concentration of, e.g., phosphorus, which is a PL material, is formed on an entire surface of the substrate wafer 12. As in the case of the first p+ silicon layer 24, the n+ silicon layer 26 can be formed into a single crystal by, e.g., n+ doped amorphous silicon deposition followed by solid-phase epitaxial growth. The n+ silicon layer 26 deposited on the surface other than the PL trench 26t is removed by, e.g., CMP. Then, a second single crystal p+ silicon layer 28 is similarly formed on an entire surface of the substrate wafer 12. Thus, the n+ silicon layer 26, which is a PL 26, is surrounded with the p+ silicon layers 24, 28 being electrically insulated from the substrate wafer 12. If all of the first and second p+ silicon layers 22, 28 and the n+ silicon layer 26 are formed from doped amorphous silicon, then solid-phase epitaxial growth may be carried out simultaneously for single crystallization.

Figure 19A:
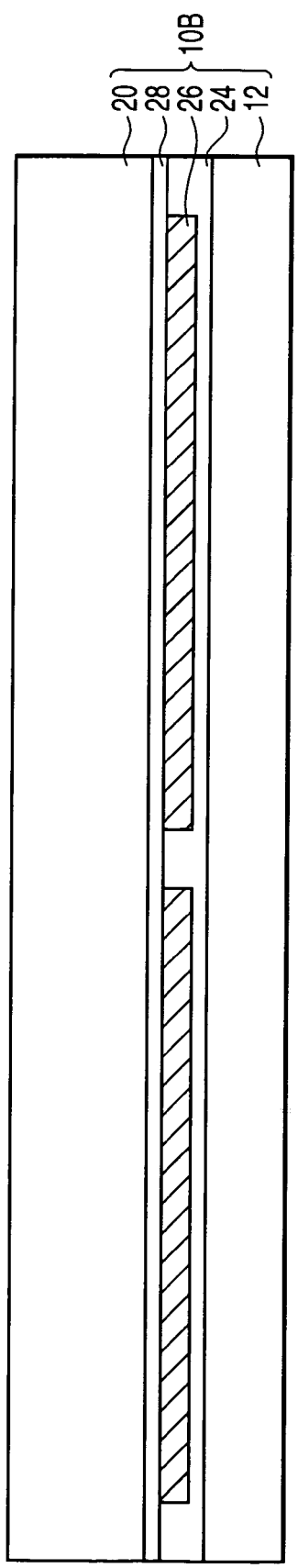
FIGS. 19A, 19B are views to explain sectional structures of the example of the manufacturing process of the semiconductor device of the second embodiment subsequent to FIGS. 18A, 18B.
Figure 19B:
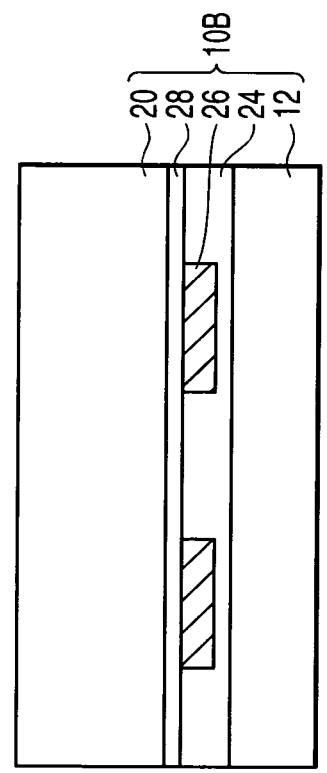

Next, a single crystal epitaxial silicon layer 20 is grown with a predetermined thickness on an entire surface of the second p+ silicon layer 28 by, e.g., epitaxial growth. In this way, the semiconductor wafer 10B having the PL 26 buried therein can be formed, as shown in FIGS. 19A, 19B. Thus, the PL 26 insulated from the surrounding substrate wafer by the pn-junction and isolated short from one another can be formed in the semiconductor wafer 10B.

(2) Next, a MOS transistor 40 is formed on the semiconductor wafer 10B. Since the manufacturing process is similar to that of the first embodiment shown in FIGS. 9A, 9B while patterns are only different, detailed description of thereof will be omitted. FIGS. 20A, 20B show the MOS transistor 40 formed on the semiconductor wafer 10B. The drawings show an isolation 36, a gate insulator 42, a gate electrode 44, and a source/drain 46. To form the trench type FeRAM with the TC parallel unit serial connection type, for example, MOS transistors 40a and 40b are arranged to share one source/drain 46b, and MOS transistors 40b and 40c are arranged to share another source/drain 46c.

(3) A trench ferroelectric capacitor 50 is formed in an odd-numbered source/drain 46 of the MOS transistor 40. However, two trench ferroelectric capacitors 50b, 50c are formed in an inside odd-numbered source/drain 46 (e.g., source/drain 46c in FIG. 21A) excluding both ends. A method for forming the trench ferroelectric capacitor 50 is similar to that of the first embodiment, and thus detailed description thereof will be omitted. As shown in FIGS. 21A, 21B, in the odd-numbered source/drain 46 (e.g., 46a and 46c), a trench ferroelectric capacitor 50 that includes a trench sidewall insulator 54, a lower electrode 56, a ferroelectric film 58 as a capacitive insulator, and an upper electrode 60 is formed. The lower electrode 56 of the trench ferroelectric capacitor 50 is directly connected to the PL 26, and the upper electrode 60 thereof is also directly connected to the source/drain 46. Lower electrodes 56a, 56b of the two trench ferroelectric capacitors 50a, 50b are connected in common to a short PL 26a.

(4) Next, a trench contact 80 is formed in an even-numbered source/drain 46 of the MOS transistor 40. A method for forming the trench contact 80 is substantially similar to a part of that of the trench ferroelectric capacitor 50, and thus explanation will be brief.

As shown in FIG. 22A, a contact trench 80t with a depth reaching to the PL 26 (e.g., PL 26a) is formed in the even-numbered source/drain 46 (e.g., 46b). An inner wall of the trench 80t is covered with a trench sidewall insulator 78. For the trench sidewall insulator 78, e.g., an $SiO_2$ film formed by thermal oxidation can be used. An upper part of the trench sidewall insulator 78 is removed to form a contact portion with the source/drain 46. Then, the trench insulator 78 on a bottom of the trench 80t is removed by anisotropic dry etching to form a contact portion with the PL 26.

Subsequently, a plug material, such as n+ polysilicon, is deposited on an entire surface to fill inside of the trench 80t. Then, the polysilicon deposited on the surface other than the trench 80t is removed and simultaneously planarized by etching-back, whereby the trench contact 80 shown can be formed, as shown in FIG. 22A.

(5) Next, a hydrogen barrier film 62 and an interlevel insulator 64 are formed.

Before forming these insulators, annealing is executed in an atmosphere containing oxygen to recover damages in the ferroelectric film 58 caused during the formation of the trench ferroelectric capacitor 50. Then, as shown in FIGS. 23A, 23B, the hydrogen barrier film 62 is formed on an entire surface. For the hydrogen barrier film 62, e.g., $Al_2O_3$, SiN, SiON, $TiO_2$ or the like can be used. Further, the interlevel insulator 64 is formed on an entire surface of the hydrogen barrier film 62, and planarized by, e.g., CMP, to form a structure shown in FIGS. 23A, 23B.

Subsequently, a process such as multilevel wiring necessary for the semiconductor device is carried out to complete the semiconductor device which includes the FeRAM.

Therefore, the trench type FeRAM with the TC parallel unit serial connection type can be formed in the semiconductor wafer 10B having the buried PL 26 insulated from the substrate wafer by the pn-junction.

According to the embodiment, the semiconductor device including the FeRAM has a structure suitable for miniaturization and easy to manufacture, and has less restrictions on materials to be used. Specifically, the PL 26 is directly connected to the lower electrode 56 of the trench ferroelectric capacitor 50, and the upper electrode 60 is directly connected to the source/drain 46. Thus forming of the contact plug on the wafer is unnecessary, and realizing a structure suitable for high integration. Further, for materials to be used, materials similar to those for the conventional planar or trench type FeRAM can be used.

(Third Embodiment)

A third embodiment is a trench type ferroelectric random access memory (FeRAM) with a TC parallel unit serial connection type is formed using a silicon-on-insulator (SOI) semiconductor wafer 11.

Figures 24A, 24B:
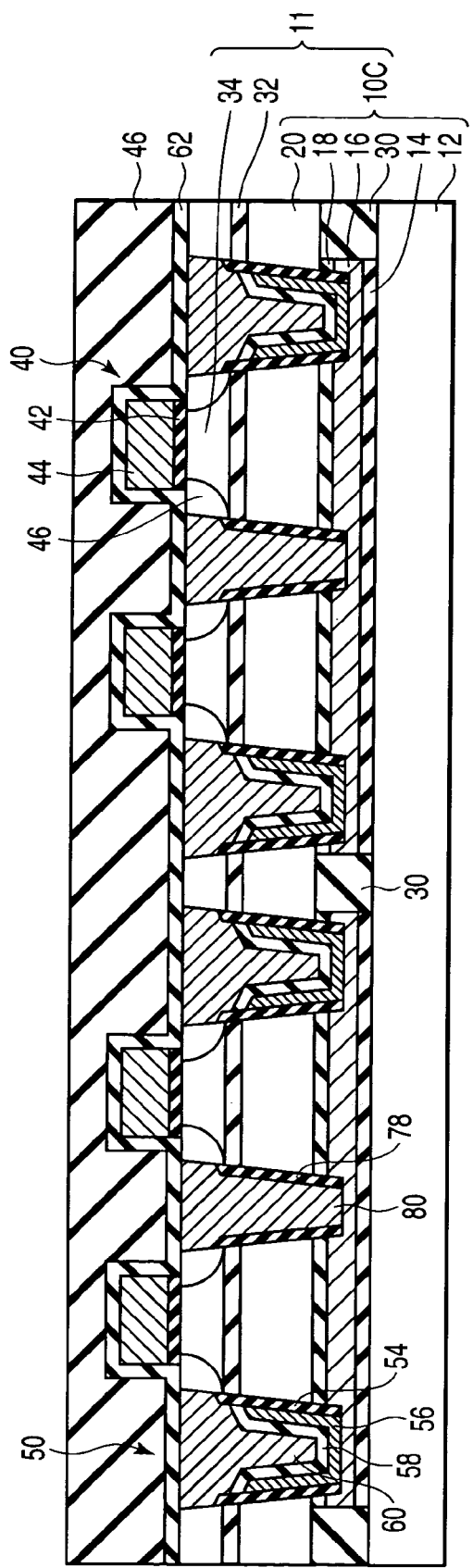
FIGS. 24A, 24B are views to explain sectional structures of an example of a semiconductor device according to a third embodiment of the present invention.

The third embodiment is shown in FIGS. 24A, 24B. According to the third embodiment, the semiconductor wafer 11 with an SOI structure, which has a silicon-on-insulator (SOI) layer 34 formed via a buried oxide film 32 (BOX: buried oxide) on a semiconductor wafer 10C is used. The semiconductor wafer 10C is formed by burying a PL 16 insulated by an insulator in the wafer. The trench type FeRAM with the TC parallel unit serial connection type is formed using the SOI wafer 11. FIG. 24A is illustrated to explain a sectional structure in a direction along the PL 16, and FIG. 24B is illustrated to explain a sectional structure in a direction parallel to a WL 44 perpendicular to the PL 16. As shown in FIGS. 24A, 24B, the PL 16 of the embodiment is insulated from the substrate wafer by insulators 14, 18 as in the case of the first embodiment. Moreover, to further enhance reliability of isolation between short PLs 16 adjacent in its longitudinal direction, the PLs 16 are isolated by a plate line isolation (PL isolation) 30 each other.

A manufacturing process of the embodiment will be described mainly with reference to a manufacturing process of the semiconductor wafer 11 with the SOI structure.

Figure 25A:
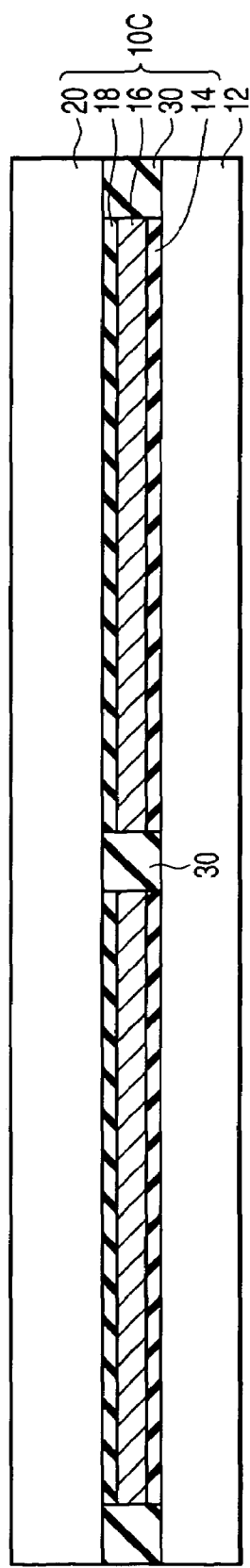
FIGS. 25A, 25B are views to explain sectional structures of an example of a manufacturing process of the semiconductor device of the third embodiment.
Figure 25B:
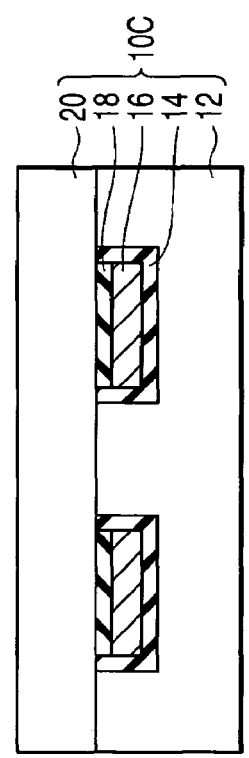

(1) In the embodiment, a semiconductor wafer 10C is used as a handle wafer, or supporting wafer, for a semiconductor wafer 11 with a SOI structure. In the handle wafer 10C, a PL 16 insulated by insulators 14, 18 is formed, as shown in FIGS. 25A, 25B. According to the manufacturing method, for example, a long PL 16 is formed first as in the case of the first embodiment. For a trench type FeRAM with a TC parallel unit serial connection type, a short PL 16 isolated from one another is necessary as in the case of the second embodiment. To isolate the PL 16 short, a PL isolation 30 is formed to make the PL 16 short by a process similar to an STI isolation process of the MOS transistor 40.

Next, a silicon layer 20 is formed by epitaxial growth. However, a thickness of the epitaxial silicon layer 20 is determined by an SOI wafering method, and is adjusted to be suitable for respective method. For example, if the SOI wafer is formed by wafer bonding, then the thickness of the epitaxial silicon layer 20 is set thinner. If the SOI wafer is formed by high energy oxygen ion implantation, the thickness of the epitaxial silicon layer 20 needs not to be adjusted. Thus, the handle wafer 10C for the SOI wafer can be formed. In FIGS. 25A, 25B, the epitaxial silicon layer 20 is formed thin to be suitable for wafer bonding.

Figure 26A:
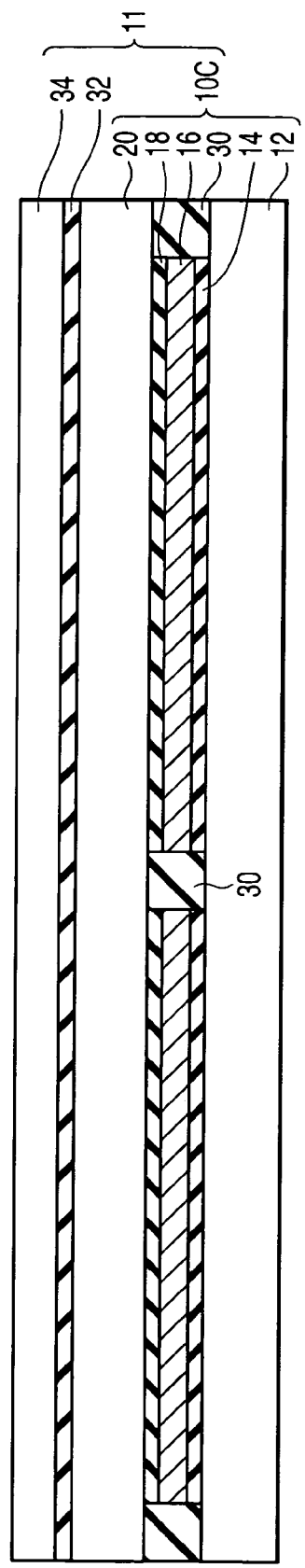
FIGS. 26A, 26B are views to explain sectional structures of the example of the manufacturing process of the semiconductor device of the third embodiment subsequent to FIGS. 25A, 25B.
Figure 26B:
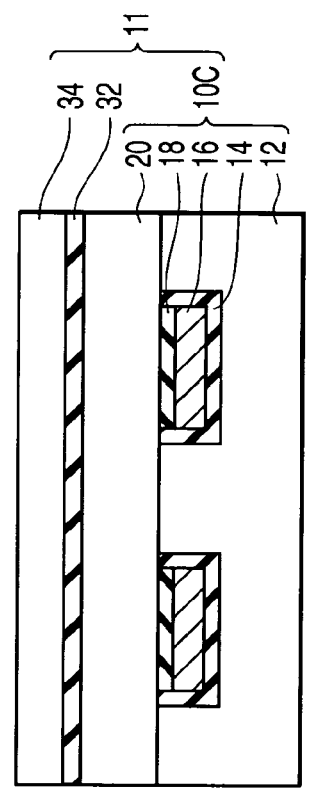

(2) Using the handle wafer 10C, the semiconductor wafer 11 with the SOI structure shown in FIGS. 26A, 26B is formed by, e.g., wafer bonding, ion implantation or the like. In the wafer bonding, a handle wafer and a bonding wafer are prepared. For the bonding wafer, e.g., a wafer in which a single crystal silicon film is formed on porous silicon, or a wafer in which high concentration hydrogen is ion-implanted near a surface can be used. After forming an oxide film ($SiO_2$), which becomes a buried oxide (BOX), on one of the handle wafer 10C or the bonding wafer, or both, the handle wafer 10C and the bonding wafer are bonded together. Then, for example, the bonding wafer is separated at the porous silicon layer or the hydrogen ion implanted layer from the handle wafer 10C. Thus a BOX layer 32 and an SOI layer 34 are formed on the handle wafer 10C, as shown in FIGS. 26A, 26B.

In this way, the semiconductor wafer 11 with the SOI structure having the SOI layer 34 formed via the BOX layer 32 on the handle wafer 10C having the buried PL 16 isolated by insulators 14, 18 and isolated short by the PL isolation 30 can be formed.

(3) Next, a MOS transistor 40 is formed on the semiconductor wafer 11 with the SOI structure. The MOS transistor 40 is formed on the SOI layer 34 of the semiconductor wafer 11, as shown in FIGS. 27A, 27B. A manufacturing process is similar to that of the second embodiment, and thus detailed description thereof will be omitted. The drawings show an isolation 36, a gate insulator 42, a gate electrode 44, and a source/drain 46. The isolation 36 can be formed either by oxidizing the entire SOI layer 34 of a predetermined area by thermal oxidation or by the STI 36 used in the second embodiment.

(4) As shown in FIGS. 28A, 28B, a trench ferroelectric capacitor 50 is formed in the source/drain 46 of the MOS transistor 40. One trench ferroelectric capacitor 50a is formed in the source/drain 46 of both ends (e.g., source/drain 46a), and two trench ferroelectric capacitors 50b, 50c are formed in an inside odd-numbered source/drain 46 (e.g., source/drain 46c). A lower electrode 56 of the trench ferroelectric capacitor 50 is directly connected to the PL 16 isolated by the PL isolation 30 in the wafer, and an upper electrode 60 is directly connected to the source/drain 46. Lower electrodes 56 of the trench ferroelectric capacitors 50 of (2n−1)-th and 2n-th are connected to an n-th PL 16, where n is an integer. For example, lower electrodes 56a, 56b are connected to a PL 16a.

Next, a trench contact 80 is formed in an even-numbered source/drain 46 (e.g., 46b) of the MOS transistor 40. The n-th PL 16 (e.g., 16a) is connected to an n-th trench contact 80 (e.g., 80a).

Then, a hydrogen barrier film 62 and an interlevel insulator 64 are deposited on an entire surface of the semiconductor wafer 11, and planarized, whereby a structure can be formed as shown in FIGS. 28A, 28B.

Therefore, the trench type FeRAM with the TC parallel unit serial connection type can be formed in the semiconductor wafer 11 with the SOI structure which has the short PL 16 insulated from the substrate wafer by the insulator, isolated from one another by the PL isolation 30, and buried in the wafer.

Further, a process such as multilevel wiring necessary for the semiconductor device is carried out to complete the semiconductor device comprising the FeRAM.

According to the embodiment, the semiconductor device comprising the FeRAM has a structure suitable for miniaturization and easy to manufacture, and has less restrictions on materials to be used. In the semiconductor device, the trench type FeRAM is formed in the semiconductor wafer 11 having the SOI layer 34 the BOX layer 32, and the PL 16, which is buried in the wafer and isolated short by the PL isolation 30. Moreover, the lower electrode 56 of the trench ferroelectric capacitor 50 is directly connected to the PL 16, and the upper electrode 60 is also directly connected to the source/drain 46. Thus forming of the contact plug is unnecessary, and realizing a structure suitable for high integration. Further, for materials to be used, materials similar to those for the conventional planar or trench type FeRAM can be used.

The first to third embodiments of the present invention can be implemented in various modifications. Some examples will be described below with reference to FIGS. 29A, 29B to FIGS. 43A, 43B. Each drawing is illustrated to explain a sectional structure. Each drawing A of FIG. 29A to FIG. 43A illustrates a sectional structure in a direction parallel to a PL, and each drawing B illustrates a sectional structure in a direction parallel to a WL perpendicular to the PL.

Modifications 1 to 3 are related to a single trench type FeRAM.

(Modification 1)

In the first embodiment, a single trench type FeRAM is formed using a semiconductor wafer 10A formed by burying a PL 16 insulated from a substrate wafer by an insulator. However, it may be used a semiconductor wafer 10B shown in the second embodiment formed by burying a PL 26 insulated from the substrate wafer by pn-junction.

A modification 1 is the single trench type FeRAM formed by using the semiconductor wafer 10B in which the PL 26 is formed by insulating with pn-junction and buried in the wafer, as shown in FIGS. 29A, 29B.

In the semiconductor wafer 10B, the PL 26 constituted of an n+ silicon layer 26 and electrically insulated from a substrate wafer 12 by first and second p+ silicon layers 24, 28 is formed. A MOS transistor 40 and an isolation 36 are formed in the semiconductor wafer 10B. A trench ferroelectric capacitor 50 (e.g., 50a) is formed in one source/drain 46 (e.g., 46a) of the MOS transistor 40 (e.g., 40a). A lower electrode 56 (e.g., 56a) of the trench ferroelectric capacitor 50 is directly connected to the PL 26. An upper electrode 60 (e.g., 60a) is also directly connected to the source/drain 46 (e.g., 46a). A contact plug 68 for connection with a BL 70 being formed above the wafer is formed on the other source/drain 46 (e.g., 46b) of the MOS transistor 40 (e.g., 40a).

Thus, according to the modification 1, it may be formed the semiconductor device with the trench type FeRAM, which has a structure suitable for miniaturization and high integration.

(Modification 2)

A modification 2 is a single trench type FeRAM formed by applying an inter-plate isolation 38 to a semiconductor wafer 10A of the first embodiment, as shown in FIGS. 30A, 30B. The inter-plate isolation 38 commonly isolates between PLs 16 and between trench ferroelectric capacitors 50.

The PL 16 insulated from a substrate wafer 12 by first and second insulators 14, 18 is formed in a semiconductor wafer 10A. A MOS transistor 40, an isolation 36, and the inter-plate isolation 38 are formed in the semiconductor wafer 10A. The inter-plate isolation 38 also simultaneously executes isolation between the MOS transistor 40 in a WL 44 direction as well as isolation between PLs 16 and between the trench ferroelectric capacitors 50. Accordingly, the inter-plate isolation 38 is a deep trench isolation deeper than a lower end of the PL 16. The inter-plate isolation 38 can be formed either before the formation of the MOS transistor 40 as in the case of the isolation 36 or after the formation of a trench ferroelectric capacitor 50. After forming a memory unit including the MOS transistor 40, the trench ferroelectric capacitor 50 and the inter-plate isolation 38, a contact plug 68 for connecting with a BL 70 being formed above, and the BL 70 are formed.

According to the modification 2, by using an inter-plate isolation 38, it may be enhanced reliability of isolation between the MOS transistors 40, between the trench ferroelectric capacitors 50, and between the PLs 16 even if the semiconductor device is miniaturized to reduce a space between the PLs 16.

(Modification 3)

A modification 3 is another application of a inter-plate isolation 38 of the modification 2 to a single trench type FeRAM of the modification 1, which uses a semiconductor wafer 10B having a PL 26 insulated from a substrate wafer by pn-junction, as shown in FIGS. 31A, 31B.

In the semiconductor wafer 10B, the PL 26 constituted of an n+ silicon layer 26 and electrically insulated from the substrate wafer 12 by first and second p+ silicon layers 24, 28 is formed. A MOS transistor 40, an isolation 36, and the inter-plate isolation 38 are formed in the semiconductor wafer 10B. A trench ferroelectric capacitor 50 is formed in one source/drain 46a of a MOS transistor 40a. A lower electrode 56 of the trench ferroelectric capacitor 50 is directly connected to the PL 26. An upper electrode 60 is also directly connected to the source/drain 46a. A contact plug 68 for connection with a BL 70 being formed above is formed on the other source/drain 46b of the MOS transistor 40a.

By the structure of the modification 3 using the inter-plate isolation 38, it may be enhanced reliability of isolation between the MOS transistors 40, between the trench ferroelectric capacitors 50, and between the PLs 26 even if the semiconductor device is miniaturized to reduce a space between the PLs 26.

Modifications 4 to 10 relate to a trench type FeRAM with a TC parallel unit serial connection type.

(Modification 4)

Figure 32A:
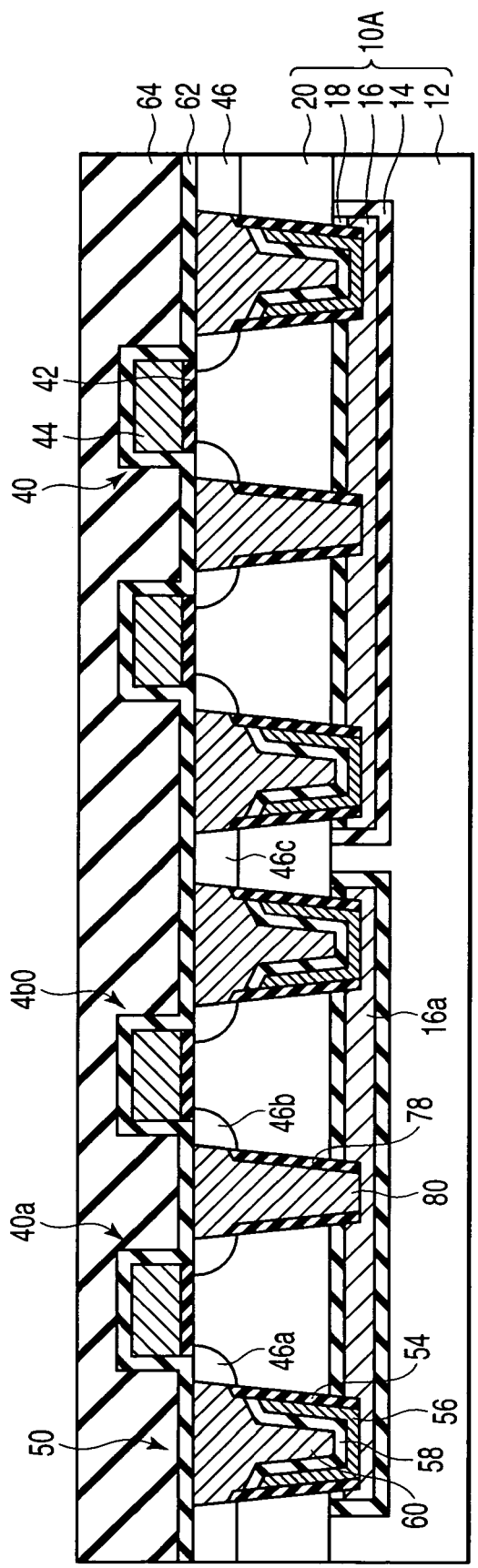
FIGS. 32A, 32B are views to explain sectional structures of an example of a semiconductor device according to a modification 4 of the present invention.
Figure 32B:
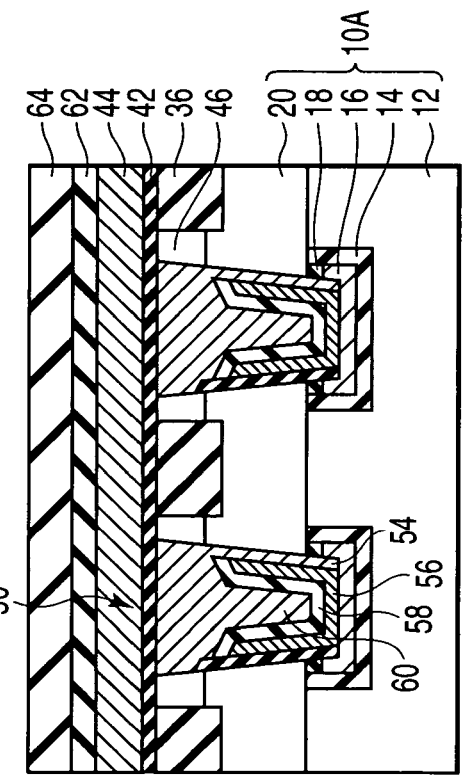

A modification 4 is a trench type FeRAM with the TC parallel unit serial connection type formed by applying a semiconductor wafer 10A to the second embodiment, as shown in FIGS. 32A, 32B. The semiconductor wafer 10A used in the first embodiment has a PL 16 insulated from a substrate wafer by an insulator.

The PL 16 insulated from the substrate wafer 12 by first and second insulators 14, 18 is formed in the semiconductor wafer 10A. As in the case of the second embodiment, a MOS transistor 40 and the trench type FeRAM with the TC parallel unit serial connection type are formed in the semiconductor wafer 10A. A trench ferroelectric capacitor 50 is formed in an odd-numbered source/drain 46 of the MOS transistor 40. A lower electrode 56 of the trench ferroelectric capacitor 50 is directly connected to one PL 16 isolated short in the wafer, and an upper electrode 60 is also directly connected to the source/drain 46. A trench contact 80 is formed in an even-numbered source/drain 46 of the MOS transistor 40. An n-th trench contact 80 is connected to an n-th PL 16, where n is an integer.

Thus, it may be formed the trench type FeRAM with the TC parallel unit serial connection type in the semiconductor wafer 10A having the PL 16 insulated from the substrate wafer 12 by the insulator.

(Modification 5)

A modification 5 is a trench type FeRAM with a TC parallel unit serial connection type formed by applying a semiconductor wafer 10C to the modification 4, as shown in FIGS. 33A, 33B. The semiconductor wafer 10C has a PL 16 insulated from a substrate wafer 12 by a insulator and isolated short by a PL isolation 30, as in the third embodiment.

The PL 16 insulated from the substrate wafer 12 by first and second insulators 14, 18 and isolated shot by the PL isolation 30 is formed in the semiconductor wafer 10C. As in the case of the second embodiment, the trench type FeRAM with the TC parallel unit serial connection type is formed in the semiconductor wafer 10C.

According to the modification, it may be enhanced reliability of isolation between PLs.

(Modification 6)

A modification 6 is a trench type FeRAM with a TC parallel unit serial connection type formed by applying an inter-plate isolation 38 to a semiconductor wafer 10A of the modification 4, which has a PL 16 insulated from a substrate wafer 12 by a insulator, as shown in FIGS. 34A, 34B.

The PL 16 insulated from the substrate wafer 12 by first and second insulators 14, 18 is formed in the semiconductor wafer 10A. As in the case of the second embodiment, the trench type FeRAM with the TC parallel unit serial connection type is formed in the semiconductor wafer 10A, however the inter-plate isolation 38 is formed instead of an isolation 36. The inter-plate isolation 38 is a deep trench isolation, which simultaneously executes isolation between MOS transistors 40 in a WL 44 direction as well as isolations between PLs 16 and between trench ferroelectric capacitors 50.

According to the modification, it may be enhanced reliability of isolation between the MOS transistors, between the trench ferroelectric capacitors, and between the PLs even if the semiconductor device is miniaturized to reduce a space between the PLs.

(Modification 7)

A modification 7 is a trench type FeRAM with a TC parallel unit serial connection type formed by further applying a PL isolation 30 to the modification 6, as shown in FIGS. 35A, 35B.

A PL 16 insulated from a substrate wafer 12 by first and second insulators 14, 18 and further isolated by the PL isolation 30 is formed in the semiconductor wafer 10C. As in the case of the second embodiment, the trench type FeRAM with the TC parallel unit serial connection type is formed in the semiconductor wafer 10C, however the inter-plate isolation 38 is formed instead of an isolation 36. The inter-plate isolation 38 is a deep trench isolation which simultaneously executes isolation between MOS transistors 40 in a WL 44 direction and isolation between PLs 16.

According to the modification, it may be possible to simultaneously enhance reliability between the MOS transistors, between the trench ferroelectric capacitors, and between the PLs even if the semiconductor device is miniaturized to reduce a space between the PLs.

(Modification 8)

A modification 8 is a trench type FeRAM with a TC parallel unit serial connection type formed by applying a PL isolation 30 to the second embodiment, as shown in FIGS. 36A, 36B.

A semiconductor wafer 10D has a structure in which a PL 26 is buried in the wafer, electrically insulated therefrom by pn-junction, and isolated short in its longitudinal direction by the PL isolation 30. Using the semiconductor wafer 10D, as in the case of the second embodiment, the trench type FeRAM with the TC parallel unit serial connection type is formed.

According to the modification, it may be enhanced reliability of isolation between PLs.

(Modification 9)

A modification 9 is a trench type FeRAM with a TC parallel unit serial connection type formed by applying an inter-plate isolation 38 to the second embodiment, as shown in FIGS. 37A, 37B.

A PL 26 constituted of an n+ silicon layer 26 and electrically insulated from a substrate wafer 12 by first and second p+ silicon layers 24, 28 is formed in a semiconductor wafer 10B. As in the case of the second embodiment, the trench type FeRAM with the TC parallel unit serial connection type is formed in the semiconductor wafer 10B, however the inter-plate isolation 38 is formed instead of an isolation 36. The inter-plate isolation 38 is a deep trench isolation which simultaneously executes isolation between MOS transistors 40 in a WL 44 direction as well as isolations between PLs 16 and between trench ferroelectric capacitors 50.

According to the modification, it may be enhanced reliability of isolation between the MOS transistors, between the trench ferroelectric capacitors, and between the PLs even if the semiconductor device is miniaturized to reduce a space between the PLs.

(Modification 10)

A modification 10 is a trench type FeRAM with a TC parallel unit serial connection type formed by applying an inter-plate isolation 38 to the modification 8, in which a PL isolation 30 is applied, as shown in FIGS. 38A, 38B.

In a semiconductor wafer 10D, a PL 26 constituted of an n+ silicon layer 26 is formed and electrically insulated from a substrate wafer 12 by first and second p+ silicon layers 24, 28, and is further isolated in its longitudinal direction by the PL isolation 30. As in the case of the second embodiment, the trench type FeRAM with the TC parallel unit serial connection type is formed in the semiconductor wafer 10D, however the inter-plate isolation 38 is formed instead of an isolation 36. The inter-plate isolation 38 is a deep trench isolation, which simultaneously executes isolation between MOS transistors 40 in a WL 44 direction as well as isolations between PLs 16 and between trench ferroelectric capacitors 50.

According to the modification, it may be possible to simultaneously enhance reliability of isolation between the MOS transistors, between the trench ferroelectric capacitors, and between the PLs even if the semiconductor device is miniaturized to reduce a space between the PLs.

Modifications 11 to 15 are various examples of a trench type FeRAM applied a semiconductor wafer 11 which has an SOI structure.

(Modification 11)

A modification 11 is a single trench type FeRAM formed by applying a semiconductor wafer 11 with an SOI structure to the first embodiment, which uses a semiconductor wafer 10A having a PL 16 insulated by a insulator and formed in the wafer 10A as a handle wafer for the SOI semiconductor wafer 11.

Figure 39A:
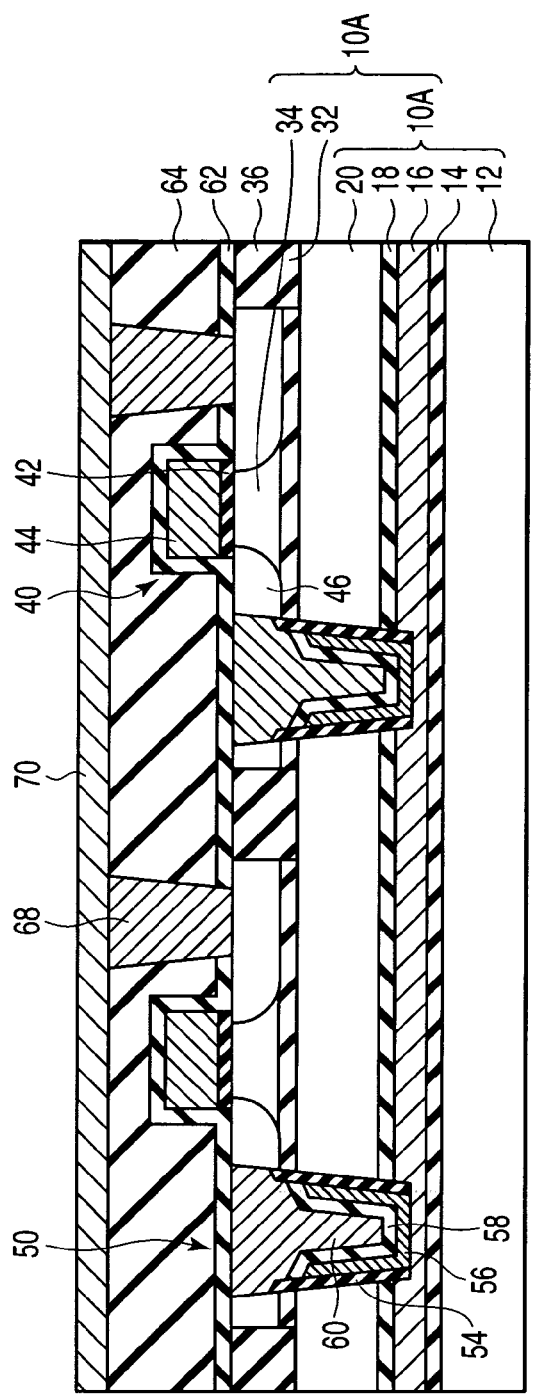
FIGS. 39A, 39B are views to explain sectional structures of an example of a semiconductor device according to a modification 11 of the present invention.
Figure 39B:
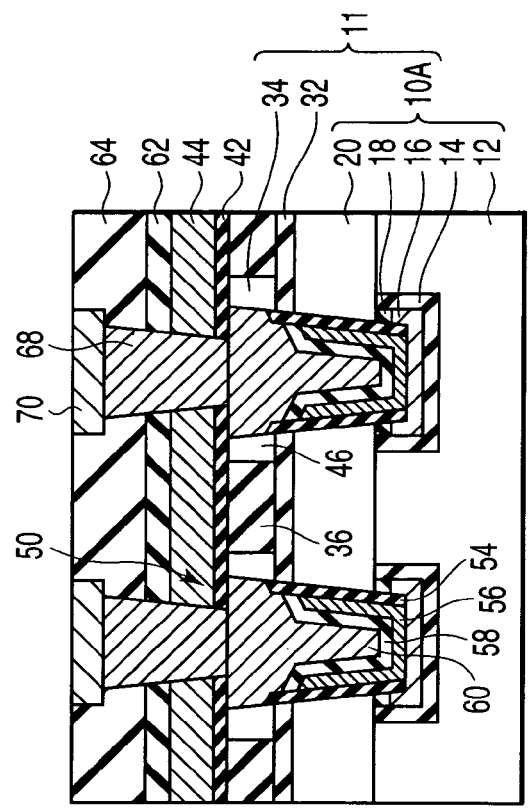

As shown in FIGS. 39A, 39B, according to the modification, the semiconductor wafer 11 of the SOI structure with an SOI layer 34 formed via a BOX layer 32 on the semiconductor wafer 10A is used. In the semiconductor wafer 10A as a handle wafer for the SOI semiconductor wafer 11, the PL 16 insulated from a substrate wafer 12 by first and second insulators 14, 18 is formed. A single trench type FeRAM is formed on the SOI layer 34 of the semiconductor wafer 11 by a substantially similarly process to the first embodiment.

According to the modification, it may be improved insulation between a MOS transistor 40 and the handle wafer.

(Modification 12)

A modification 12 is a single trench type FeRAM formed by applying a semiconductor wafer 11 with an SOI structure to the modification 1, which uses a semiconductor wafer 10B having a PL 26 insulated by the pn-junction and formed in the wafer as a handle wafer for the SOI wafer 11.

As shown in FIGS. 40A, 40B, according to the modification, the semiconductor wafer 11 with the SOI structure with an SOI layer 34 formed via a BOX layer 32 on the semiconductor wafer 10B is used. In the semiconductor wafer 10B as a handle wafer for the SOI semiconductor wafer 11, a PL 26 constituted of an n+ silicon layer 26 and electrically insulated from a substrate wafer 12 by first and second p+ silicon layers 24, 28 is formed. A single trench type FeRAM is formed in the SOI layer 34 of the SOI semiconductor wafer 11 substantially similarly to the first embodiment.

According to the modification, it may be improved insulation between a MOS transistor 40 and the handle wafer 10B.

(Modification 13)

A modification 13 is a trench type FeRAM with a TC parallel unit serial connection type formed by using a semiconductor wafer 11 with an SOI structure to a semiconductor wafer 10D in the modification 8, in which a PL 26 electrically insulated from a substrate wafer by pn-junction and isolated short by a PL isolation 30 is formed.

As shown in FIGS. 41A, 41B, according to the modification, the semiconductor wafer 11 of the SOI structure with an SOI layer 34 formed via a BOX layer 32 on the semiconductor wafer 10D is used. In the semiconductor wafer 10D as a handle wafer for the SOI semiconductor wafer 11, the PL 26 constituted of an n+ silicon layer 26, electrically insulated from the substrate wafer 12 by first and second p+ silicon layers 24, 28, and isolated in its longitudinal direction by the PL isolation 30 is formed. A trench type FeRAM with a TC parallel unit serial connection type is formed in the SOI layer 34 of the SOI semiconductor wafer 11 as in the case of the third embodiment.

According to the modification, it is possible to simultaneously enhance insulation between a MOS transistor 40 and the handle wafer, and reliability of isolation between PLs.

(Modification 14)

A modification 14 is a trench type FeRAM with a TC parallel unit serial connection type formed in a semiconductor wafer with an SOI structure similar to the third embodiment, in which a PL isolation 30 is omitted from a semiconductor wafer 11 of the third embodiment.

As shown in FIGS. 42A, 42B, according to the modification, the semiconductor wafer of the SOI structure with an SOI layer 34 formed via a BOX layer 32 on the semiconductor wafer 10C is used. In the semiconductor wafer 10C as a handle wafer for the SOI semiconductor wafer, the PL 16 insulated from the substrate wafer 12 by first and second insulators 14, 18 and isolated in its longitudinal direction by a PL isolation 30 is formed. A trench type FeRAM with a TC parallel unit serial connection type is formed in the SOI layer 34 of the SOI semiconductor wafer as in the case of the third embodiment.

According to the modification, it may be improved insulation between a MOS transistor 40 and the handle wafer.

(Modification 15)

A modification 15 is a trench type FeRAM with a TC parallel unit serial connection type formed in a semiconductor wafer with an SOI structure similar to the modification 13, in which a PL isolation 30 is omitted.

As shown in FIGS. 43A, 43B, according to the modification, according to the modification, the semiconductor wafer of the SOI structure with an SOI layer 34 formed via a BOX layer 32 on the semiconductor wafer 10B is used. In the semiconductor wafer 10B as a handle wafer for the SOI semiconductor wafer, the PL 26 constituted of an n+ silicon layer 26, and electrically insulated from the substrate wafer 12 by first and second p+ silicon layers 24, 28 is formed. A trench type FeRAM with a TC parallel unit serial connection type is formed in the SOI layer 34 of the SOI semiconductor wafer as in the case of the third embodiment.

According to the modification, it may be improved insulation between a MOS transistor 40 and the handle wafer.

As described above, the present invention can provide a semiconductor device including a ferroelectric random access memory having a structure suitable for miniaturization, easy to manufacture, and having less restrictions on materials to be used, and its manufacturing method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor memory device comprising:
a plurality of field effect transistors, each of the field effect transistors formed on a surface area of a semiconductor wafer;
a plurality of trench ferroelectric capacitors, each of the trench ferroelectric capacitors including two electrodes and a ferroelectric film disposed between the electrodes and formed in the semiconductor wafer in one source/drain of the field effect transistors, wherein one electrode thereof contacts with the source/drain; and
a plurality of wirings, each of the wirings formed in the semiconductor wafer being surrounded by an electrically insulating material and connected to the other electrode of the trench ferroelectric capacitors.

2. The semiconductor memory device according to claim 1, wherein each of the wiring is insulated from surroundings in the semiconductor wafer by an insulator.

3. The semiconductor memory device according to claim 1, wherein each of the wirings is electrically insulated from surroundings in the semiconductor wafer by pn-junction.

4. The semiconductor memory device according to claim 1, further comprising a semiconductor layer formed on an insulator on the semiconductor wafer to form the sources/drains of the field effect transistors therein.

5. The semiconductor memory device according to claim 1, further comprising an isolation which insulates between the wirings and between the field effect transistors, simultaneously.

6. A semiconductor memory device comprising:
a plurality of field effect transistors, each of the field effect transistors formed on a surface area of a semiconductor wafer;
a plurality of trench ferroelectric capacitors, each of the trench ferroelectric capacitors including two electrodes and a ferroelectric film disposed between the electrodes and formed in the semiconductor wafer in one source/drain of the field effect transistors, wherein one electrode thereof contacts with the source/drain; and
a plurality of wirings, each of the wirings formed in the semiconductor wafer being surrounded by an electrically insulating material and connected to the other electrode of the trench ferroelectric capacitors; and
a transistor-capacitor parallel unit in which the field effect transistors and the trench ferroelectric capacitors are connected in parallel.

7. The semiconductor memory device according to claim 6, wherein each of the wirings is insulated from surroundings in the semiconductor wafer by an insulator.

8. The semiconductor memory device according to claim 7, wherein one wiring is isolated short from the other in a longitudinal direction of the wiring by the second insulator.

9. The semiconductor memory device according to claim 6, wherein each of the wiring is electrically insulated from surroundings in the semiconductor wafer by pn-junction.

10. The semiconductor memory device according to claim 9, wherein one wiring is isolated short from the other in a longitudinal direction of the wiring by an insulator.

11. The semiconductor memory device according to claim 6, further comprising a semiconductor layer formed on an insulator on the semiconductor wafer to form the sources/drains of the field effect transistors therein.

12. The semiconductor memory device according to claim 6, further comprising an isolation which insulates between the wirings and between the field effect transistors, simultaneously.

* * * * *